(12) United States Patent
Chen et al.

(10) Patent No.: US 11,018,104 B2
(45) Date of Patent: *May 25, 2021

(54) SEMICONDUCTOR STRUCTURE AND METHOD FOR MANUFACTURING THE SAME

(71) Applicant: TAIWAN SEMICONDUCTOR MANUFACTURING COMPANY LTD., Hsinchu (TW)

(72) Inventors: Ming-Fa Chen, Taichung (TW); Hsien-Wei Chen, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/071,895

(22) Filed: Oct. 15, 2020

(65) Prior Publication Data
US 2021/0035935 A1    Feb. 4, 2021

Related U.S. Application Data

(63) Continuation of application No. 15/792,346, filed on Oct. 24, 2017, now Pat. No. 10,818,624.

(51) Int. Cl.
*H01L 23/10* (2006.01)
*H01L 23/532* (2006.01)
(Continued)

(52) U.S. Cl.
CPC ............... *H01L 24/06* (2013.01); *H01L 24/08* (2013.01); *H01L 24/09* (2013.01); *H01L 24/05* (2013.01);
(Continued)

(58) Field of Classification Search
CPC ... H01L 23/49838; H01L 24/16; H01L 24/17; H01L 24/49; H01L 24/97; H01L 25/0657;
(Continued)

(56) References Cited

U.S. PATENT DOCUMENTS 6,555,414 B1 * 4/2003 Vanfleteren ............ H01L 24/29
   438/108
2004/0124545 A1 * 7/2004 Wang ................ H01L 23/49838
   257/784
(Continued)

*Primary Examiner* — Brian Turner
(74) *Attorney, Agent, or Firm* — WPAT, P.C., Intellectual Property Attorneys; Anthony King

(57) ABSTRACT

A semiconductor structure includes a first substrate, a first dielectric layer disposed over the first substrate, a plurality of first bonding pads disposed in the first dielectric layer, a plurality of second bonding pads disposed in the first dielectric layer, a second substrate, and a second dielectric layer disposed over the second substrate. The first bonding pads have a first width. The second bonding pads have a second width greater than the first width. The second bonding pads are arranged to form a frame pattern surrounding the first bonding pads. A portion of the second dielectric layer is in physical contact with the second bonding pads. The first bonding pads and the second bonding pads are arranged to form a plurality of columns and a plurality of rows. Two of the second bonding pads are disposed at two opposite ends of each column and two opposite ends of each row.

20 Claims, 14 Drawing Sheets

(51) Int. Cl.
*H01L 25/065* (2006.01)
*H01L 23/498* (2006.01)
*H01L 21/768* (2006.01)
*H01L 23/00* (2006.01)

(52) U.S. Cl.
CPC .... *H01L 24/80* (2013.01); *H01L 2224/05552* (2013.01); *H01L 2224/05555* (2013.01); *H01L 2224/05624* (2013.01); *H01L 2224/05647* (2013.01); *H01L 2224/0603* (2013.01); *H01L 2224/0605* (2013.01); *H01L 2224/06132* (2013.01); *H01L 2224/06179* (2013.01); *H01L 2224/08121* (2013.01); *H01L 2224/08145* (2013.01); *H01L 2224/08147* (2013.01); *H01L 2224/80895* (2013.01); *H01L 2224/80896* (2013.01); *H01L 2224/94* (2013.01)

(58) Field of Classification Search
CPC .............. H01L 24/32; H01L 2924/1517; H01L 2224/29111; H01L 2224/29139; H01L 2224/81191; H01L 2224/131; H01L 2224/0401; H05K 3/3436
See application file for complete search history.

(56) References Cited

U.S. PATENT DOCUMENTS

| | | | |
|---|---|---|---|
| 2009/0045508 A1* | 2/2009 | Romero | H05K 1/111 257/737 |
| 2012/0038061 A1* | 2/2012 | Su | H01L 23/49827 257/777 |
| 2013/0009321 A1* | 1/2013 | Kagawa | H01L 21/7684 257/774 |
| 2014/0048929 A1* | 2/2014 | Cha | H01L 24/13 257/737 |
| 2014/0138824 A1* | 5/2014 | Zhang | H01L 21/4853 257/738 |
| 2016/0064347 A1* | 3/2016 | Kuo | H01L 24/16 438/108 |

* cited by examiner

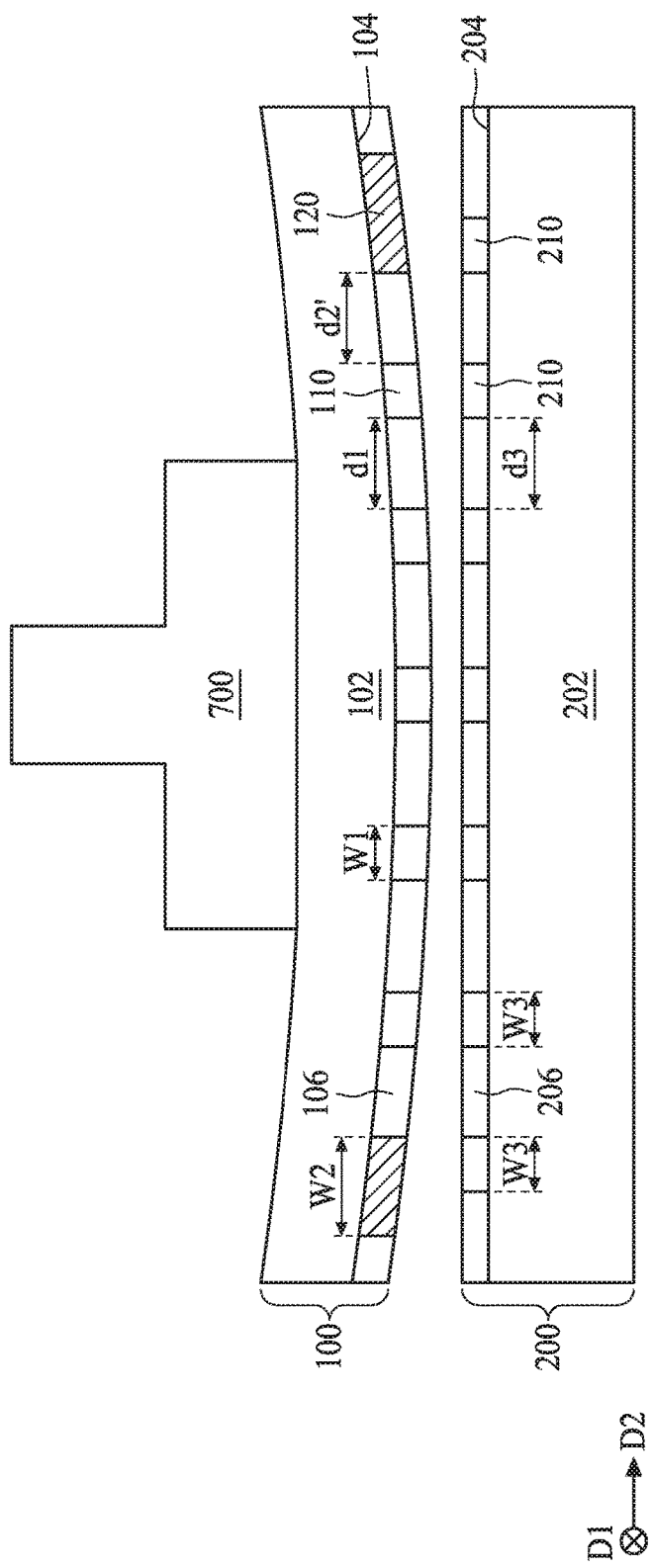
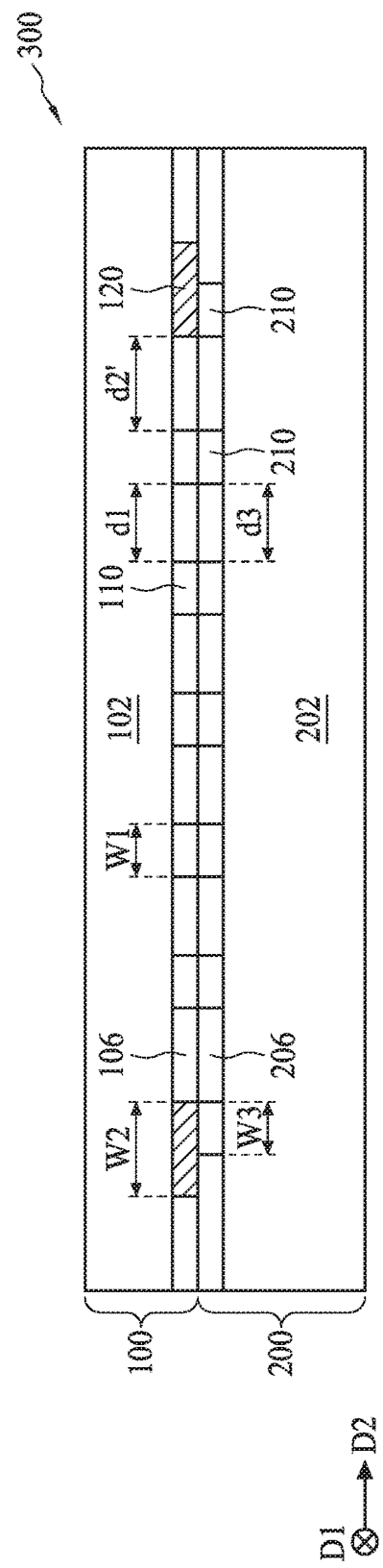
FIG. 2
FIG. 3

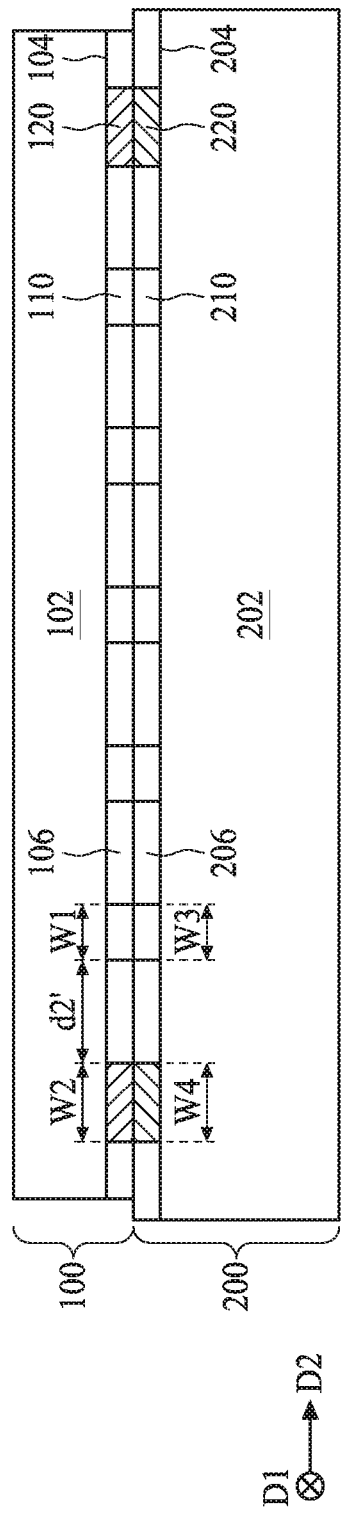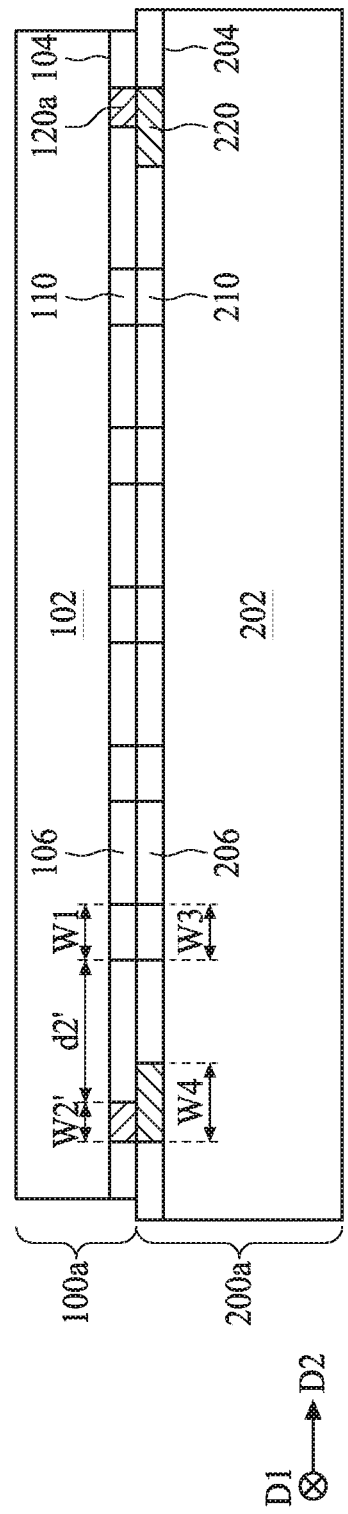

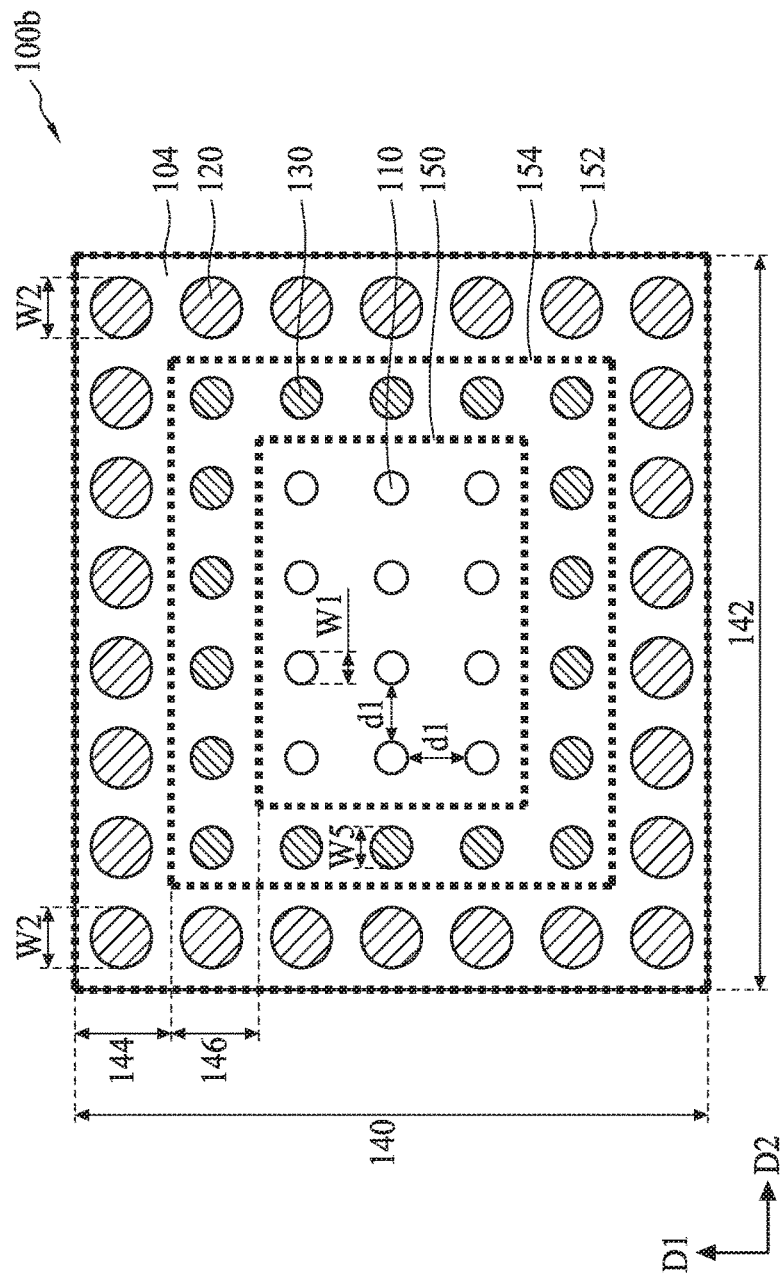
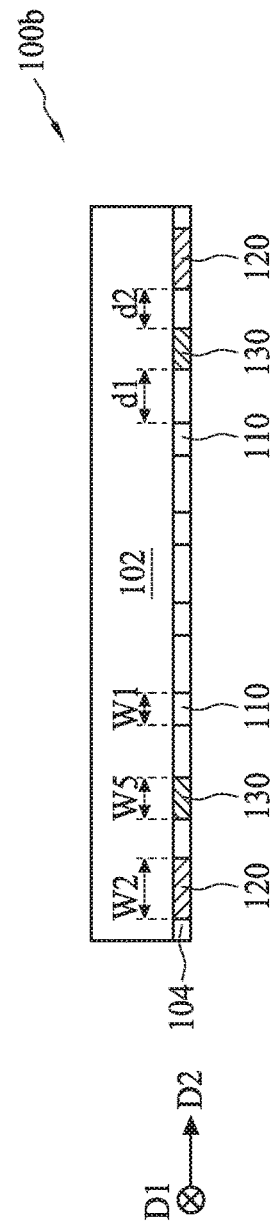
FIG. 6A
FIG. 6B

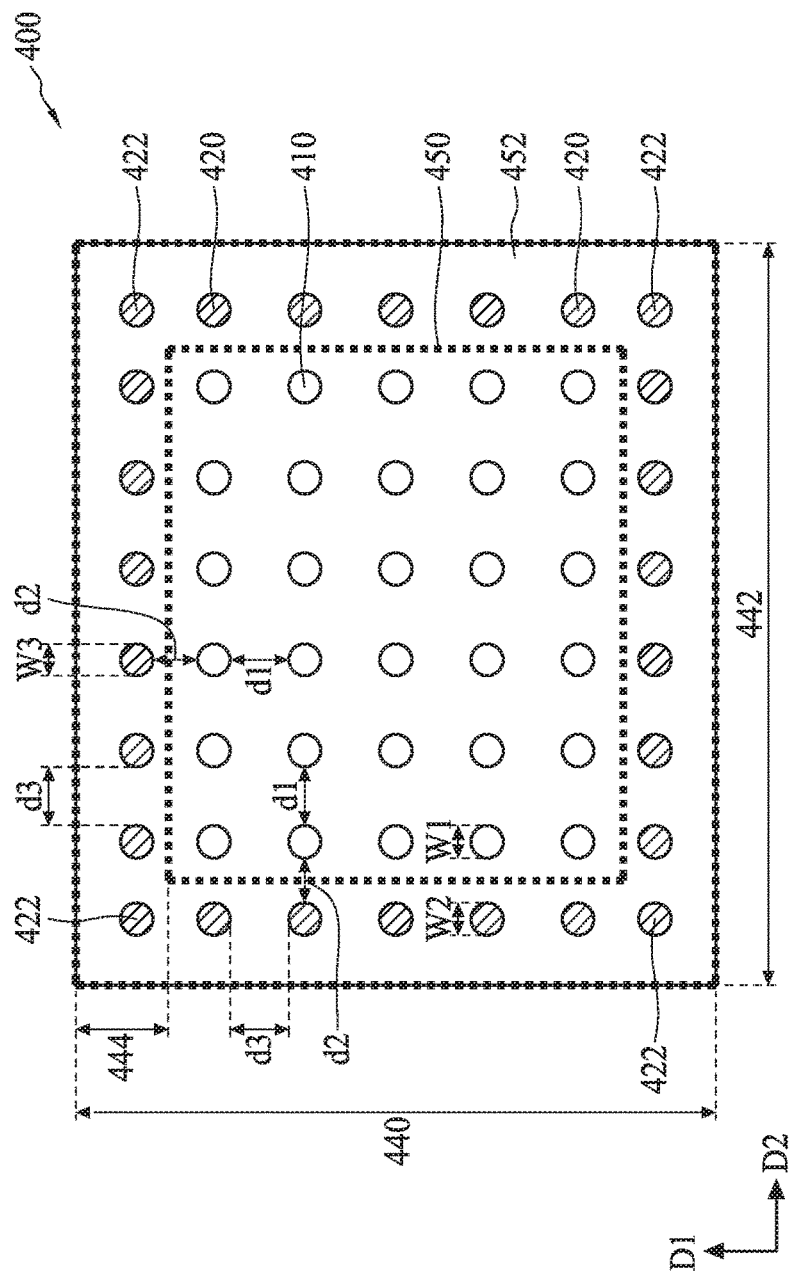
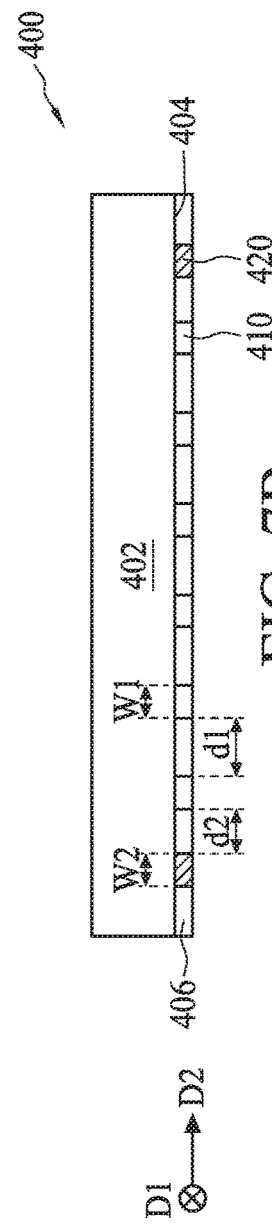
FIG. 7A
FIG. 7B

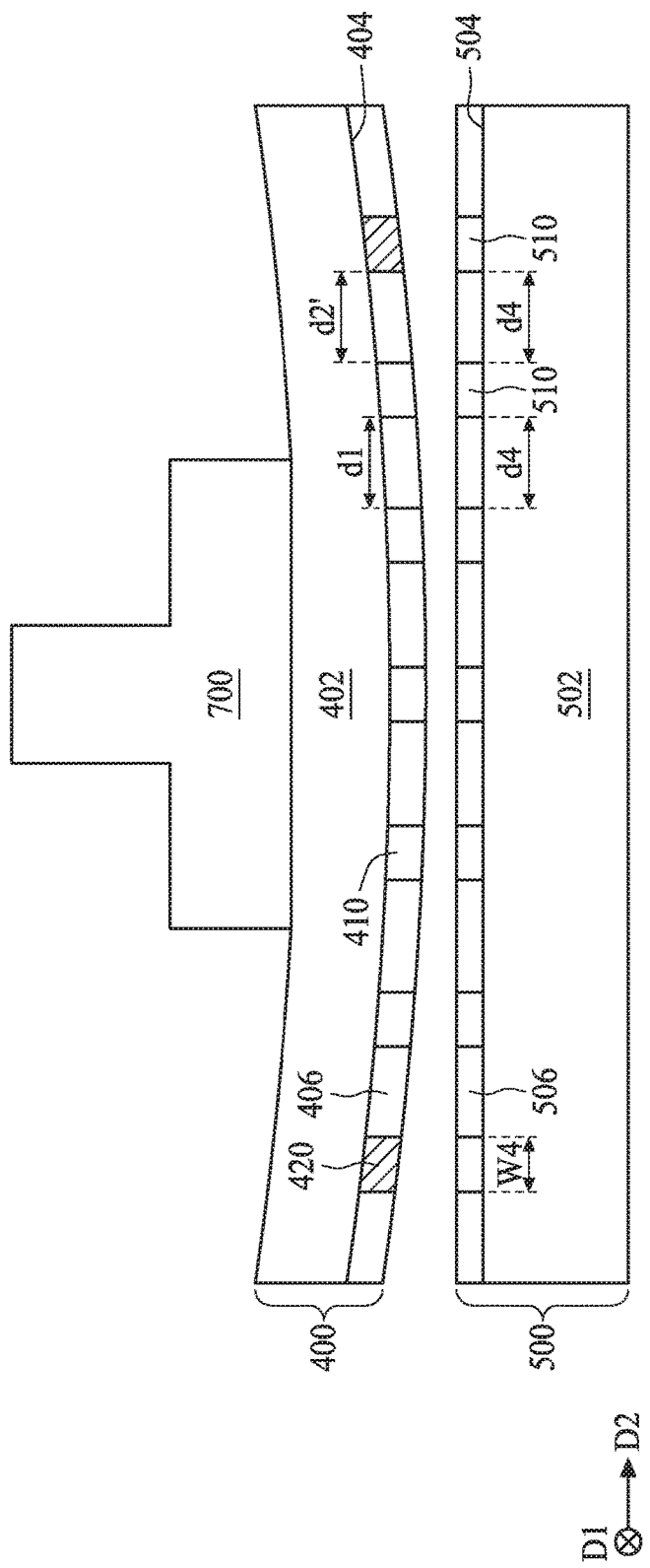
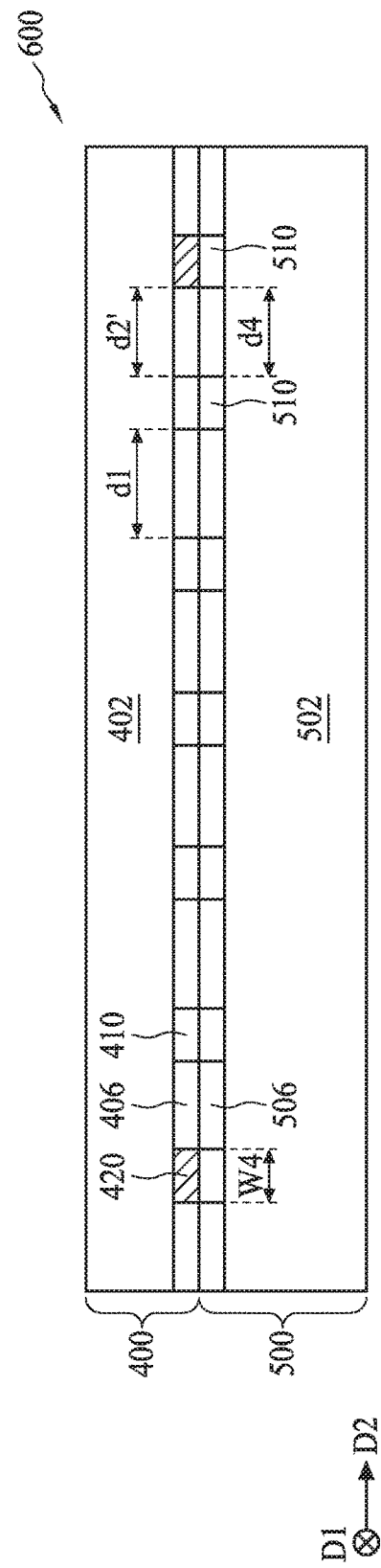
FIG. 8
FIG. 9

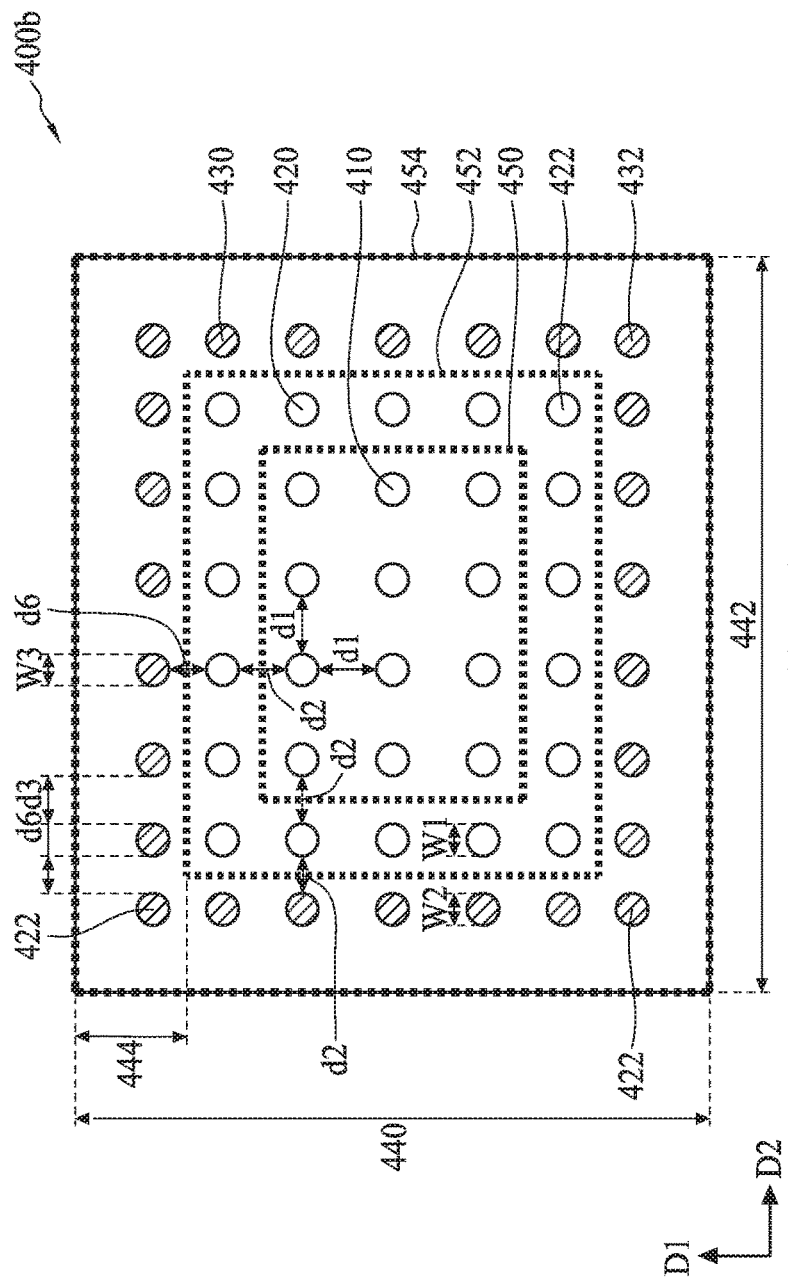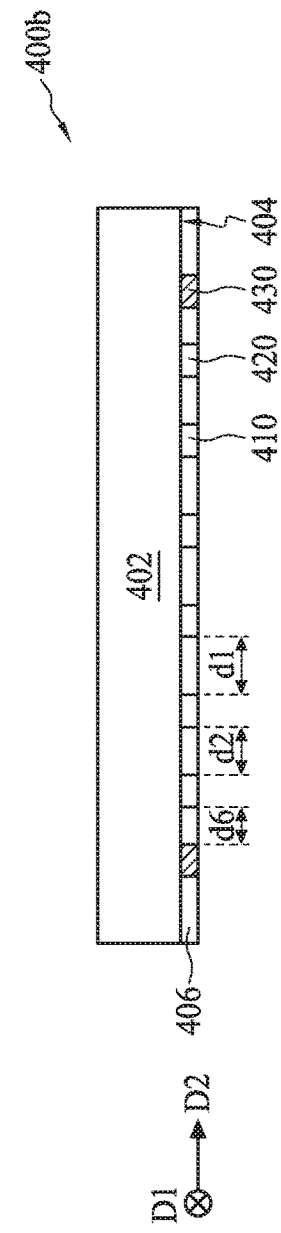
FIG. 11A
FIG. 11B

SEMICONDUCTOR STRUCTURE AND METHOD FOR MANUFACTURING THE SAME

PRIORITY CLAIM AND CROSS-REFERENCE

This application is a continuation of U.S. patent application Ser. No. 15/792,346, filed on Oct. 24, 2017, entitled of "SEMICONDUCTOR STRUCTURE AND METHOD FOR MANUFACTURING THE SAME", the entire disclosure of which is hereby incorporated by reference.

BACKGROUND

Semiconductor device are used in a variety of electronic applications, such as personal computers, cell phones, digital cameras, and other electronic equipment. Semiconductor devices are typically fabricated by sequentially depositing insulating or dielectric layers, conductive layers, and semi-conductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual ides are typically packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

Three dimension integrated circuits (3DICs) are a recent development in semiconductor packaging in which multiple semiconductor dies are stacked upon one another, such as package-on-package (PoP) an system-in-package (SiP) packaging techniques. Some 3DICs provide improved integration density and other advantages, such as faster speeds and higher bandwidth, because of the decreased length of interconnects between the stacked dies, as example. However, there are many challenges related to 3DICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A and FIG. 1B are schematic drawings illustrating a semiconductor structure according to aspects of the present disclosure in some embodiments, wherein FIG. 1A is a plan view of the semiconductor structure and FIG. 1B is a sectional view of the semiconductor structure.

FIGS. 2-3 are schematic drawings illustrating a semiconductor structure according to aspects of the present disclosure in some embodiments.

FIG. 4 is a schematic drawing illustrating a semiconductor structure according to aspects of the present disclosure in some embodiments.

FIG. 5 is a schematic drawing illustrating a semiconductor structure according to aspects of the present disclosure in some embodiments.

FIG. 6A and FIG. 6B are schematic drawings illustrating a semiconductor structure according to aspects of the present disclosure in some embodiments, wherein FIG. 6A is a plan view of the semiconductor structure and FIG. 6B is a sectional view of the semiconductor structure.

FIG. 7A and FIG. 7B are schematic drawings illustrating a semiconductor structure according to aspects of the present disclosure in some embodiments, wherein FIG. 7A is a plan view of the semiconductor structure and FIG. 7B is a sectional view of the semiconductor structure.

FIGS. 8-9 are schematic drawings illustrating a semiconductor structure according to aspects of the present disclosure in some embodiments.

FIG. 11A and FIG. 11B are schematic drawings illustrating a semiconductor structure according to aspects of the present disclosure in some embodiments, wherein FIG. 11A is a plan view of the semiconductor structure and FIG. 11B is a sectional view of the semiconductor structure.

DETAILED DESCRIPTION

Figure 1A:
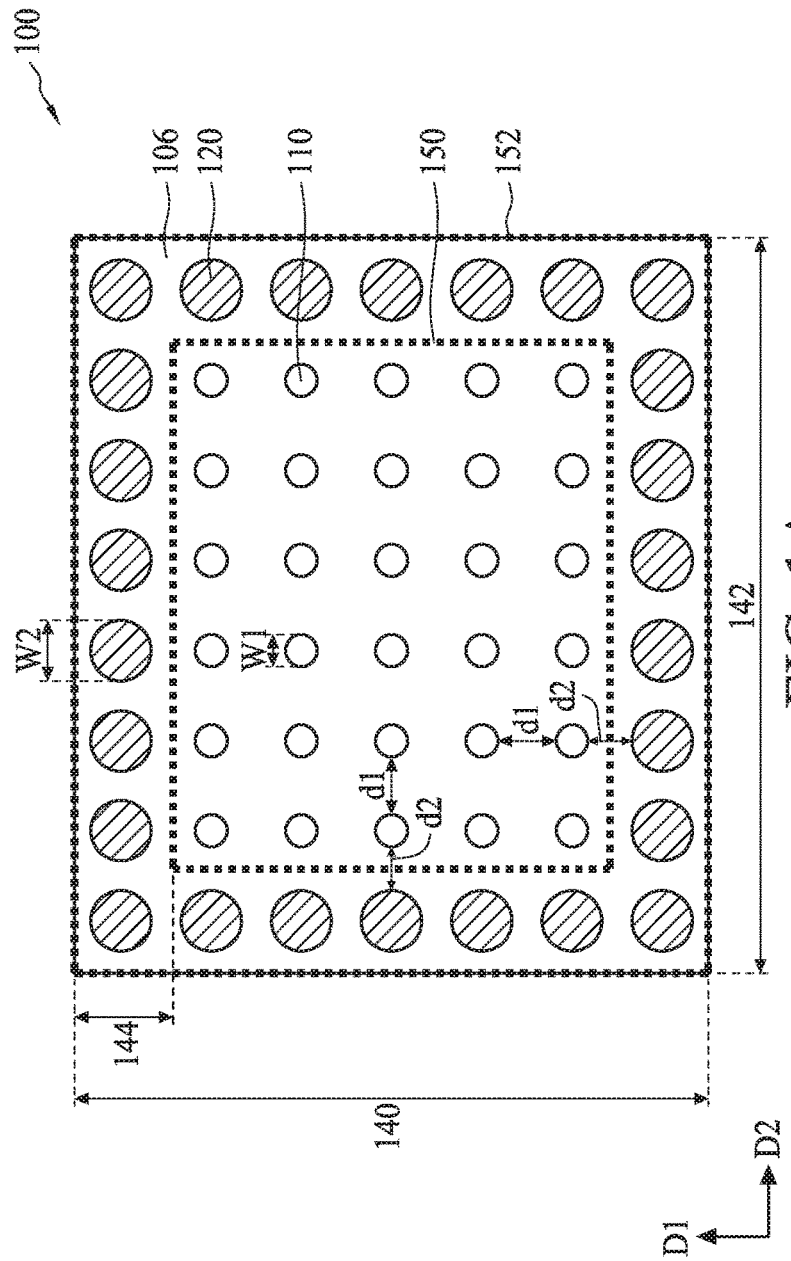

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The manufacturing of integrated circuits often involves the bonding of device dies to package substrate. In a typical bonding process, a pack-and-place tool is used to pick up, place, and stack dies onto package components one-by-one. Typically, a vacuum pick-and-place tool uses a vacuum to pick up and attach a die to a pickup head of the tool. Usually, the pickup head is provided to make contact with the majority of the surface area of the die. However, edges of the die are usually bended upwardly when placing the die onto the package substrate, and thus bonding pads near the edges of the die may be outwardly shifted. Moreover, the shifted bonding pads may not align with the corresponding pads over the package substrate. Consequently, electrical connections between the shifted bonding pads over the die and the corresponding pads over the package substrate are failed, and thus performance and reliability of the semiconductor package are adversely impacted.

One or more implementations of the present invention will now be described with reference to the attached drawings, wherein like reference numerals are used to refer to like elements throughout, and wherein the illustrated structures are not necessarily drawn to scale. As used herein, the terms "die" and "chip" are interchangeable throughout the specification.

The terms "wafer" and "substrate" used herein include any structure having an exposed surface onto which a layer is deposited according to the present invention, for example, to form the circuit structure such as a redistribution layer (RDL). The term substrate is understood to include semiconductor wafers, but not limited thereto. The term substrate is also used to refer to semiconductor structures during processing, and may include other layers that have been fabricated thereupon.

Figure 1B:
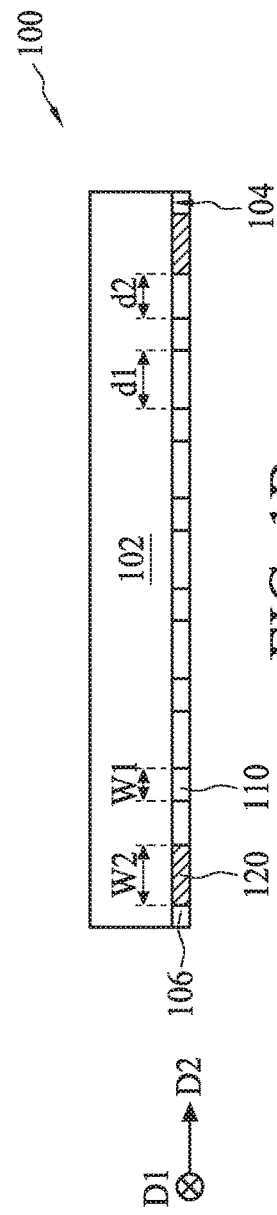

FIG. 1A and FIG. 1B are schematic drawings illustrating a semiconductor structure 100 according to aspects of the present disclosure in some embodiments, FIG. 1A is a plan view of the semiconductor structure 100 and FIG. 1B is a sectional view of the semiconductor structure 100. The semiconductor structure 100 such as a die can be vertically bonded to another semiconductor structure or a package component to form a 3DIC package. The semiconductor structure 100 can include a substrate 102, and the substrate 102 can include silicon, silicon germanium, silicon carbon, III-V compound semiconductor material, or the like. The substrate 102 may include active components or circuits, such as conductive features, implantation regions, resistors, capacitors, and other semiconductor elements e.g., transistors, diodes, etc. Those active components or circuits can be formed over the substrate 102 in front-end-of-line (FEOL) operations in some embodiments, for example. An interconnect structure (not shown) can be formed over a first surface 104 of the substrate 102 in back-end-of-line (BEOL) operations in some embodiments, for example. The interconnect structure includes conductive features, such as conductive lines and vias formed in an insulating material. In some embodiments, the insulating material can include a plurality of dielectric layers.

The semiconductor structure 100 further includes a plurality of first bonding pads 110 and a plurality of second bonding pads 120 over the first surface 104 of the substrate 102. Some of the vias electrically couple the first and second bonding pads 110 and 120 to the conductive lines in the interconnect structure, and to the circuits over the substrate 102 through the conductive lines. The vias may also couple the conductive lines in different layers. The conductive lines and the vias can include conductive materials typically used in BEOL operations, such as Cu, Al, Ti, TiN, Ta, TaN, or multiple layers or combination thereof. In some embodiments of the present disclosure, the first bonding pads 110 and the second bonding pads 120 are formed in a topmost dielectric layer 106 of the interconnection structure over the first surface 104 of the substrate 102.

Referring to FIGS. 1A and 1B, in some embodiments of the present disclosure, the semiconductor structure 100 is generally a square including a length 140 and a width 142 in a plan view. The first bonding pads 110 and the second bonding pads 120 are arranged to form an array of columns and rows as shown in FIG. 1A. For example, the first bonding pads 110 and the second bonding pads 120 are arranged to form a plurality of columns along a first direction D1, and also arranged to form a plurality of rows along a second direction D2 orthogonal to the first direction D1. In some embodiments of the present disclosure, the first bonding pads 110 are disposed in a central region 150 while the second bonding pads 120 are disposed in an edge region 152 which surrounds the central region 150. In other words, the second bonding pads 120 are disposed adjacent to the edges and/or corners of the substrate 102 as shown in FIG. 1A. In some embodiments of the present disclosure, a width 144 of the edge region 152 can be equal to or less than one-tenth of the length 140 and/or the width 142 of the semiconductor structure 100, but not limited to this.

Still referring to FIGS. 1A and 1B, the first bonding pads 110 and the second bonding pads 120 can include various shapes. For example but not limited to, the first bonding pads 110 and the second bonding pads 120 can in circular shape, elliptical shape, quadrilateral shape, octagonal shape or polygonal shape. The first bonding pads 110 respectively include a first width and the second bonding pads 120 respectively include a second width W2. In some embodiments, the first width W1 of the first bonding pads 110 is substantially different from the second width W2 of the second bonding pads 120. In some embodiments of the present disclosure, the second width W2 is substantially greater than the first width W1. In other words, at least one second bonding pad 120 including the second width W2 substantially different from the first width W1 of the first bonding pad 110 is provided. In some embodiments of the present disclosure, a difference ΔW between the first width W1 and the second width W2 can be related to a size and/or a thickness of the semiconductor structure 100. For example but not limited to, the difference ΔW can be correlated positively with the size of the semiconductor structure 100. For example but not limited to, the difference ΔW can be correlated negatively with the thickness of the semiconductor structure 100. In some embodiments of the present disclosure, the second width W2 of the second bonding pads 120 are less than 5 micrometers (μm), but not limited to this.

Still referring to FIGS. 1A and 1B, at least one of the second bonding pads 120 is adjacent to one of the first bonding pads 110. In some embodiments of the present disclosure, two adjacent first bonding pads 110 in the same column or the same row include a distance d1 therebetween, and the second bonding pad 120 and its adjacent first bonding pad 110 include a distance d2 therebetween. In some embodiments, the distance d2 is substantially less than the distance d1.

Referring to FIGS. 2-3, which are schematic drawings illustrating a semiconductor structure according to aspects of the present disclosure in some embodiments. It should be understood that similar features in FIGS. 1A-1B and 2-3 are identified by the same reference numerals for clarity and simplicity. Furthermore, similar elements in FIGS. 1A-1B and 2-3 can include similar materials, and thus those details are omitted in the interest of brevity. As shown in FIGS. 2-3, in some embodiments of the present disclosure, the semiconductor structure 100 can be bonded to another semiconductor structure 200 to form a semiconductor package 300. The semiconductor structure 200 can include a semiconductor structure or a package component. In some embodiments of the present disclosure, the semiconductor structure 200 can be a package substrate strip, an interposer wafer, a packaged wafer, a device wafer, or the like.

In some embodiments of the present disclosure, the semiconductor structure 200 can include a second substrate 202. The second substrate 202 may include active components or circuits, such as conductive features, implantation regions, resistors, capacitors, and other semiconductor elements e.g., transistors, diodes, etc. Those active components or circuits can be formed over the substrate 202 in FEOL operations in some embodiments, for example. An interconnect structure (not shown) can be formed over a second surface 204 of the second substrate 202 in BEOL operations in some embodiments, for example. As mentioned above, the interconnect structure can include conductive features, such as conductive lines and vias formed in an insulating material. In some embodiments, the insulating material can include a plurality of dielectric layers. The semiconductor structure 200 includes a plurality of third bonding pads 210 over the second surface 204 of the second substrate 202. Some of the vias electrically couple the third bonding pads 210 to the conductive lines in the interconnect structure, and to the circuits over the second substrate 202 through the conductive lines. The vias may also couple the conductive lines in different layers. The conductive lines and the vias can include conductive materials typically used in BEOL operations. In some embodiments of the present disclosure, the third bonding pads 210 are formed in a topmost dielectric layer 206 of the interconnection structure over the second surface 204 of the second substrate 202.

Still referring to FIGS. 2-3, in some embodiments of the present disclosure, the third bonding pads 210 are arranged to form an array of columns and rows. The third bonding pads 210 can include various shapes as mentioned above, thus the details are omitted for simplicity. The third bonding pads 210 respectively include a third width W3 as shown in FIGS. 2-3, In some embodiments of the present disclosure, the third width W3 of the third bonding pads 210 can be the same as the first width W1 of the first bonding pads 110. In some embodiments of the present disclosure, the third width \V can be different from the first width W1 of the first bonding pads 110. Still in some embodiments of the present disclosure, the second width W2 of the second bonding pads 120 is substantially greater than the third width W3 of the third bonding pads 210. Furthermore, in some embodiments of the present disclosure, a distance d3 between two adjacent third bonding pads 210 can be the same as the distance d1 between two adjacent first bonding pads 110.

Referring to FIGS. 2-3, a pick-and-place tool is used to pick, place and stack the semiconductor structure 100 onto the semiconductor structure 200. FIG. 2 illustrates a pickup head 700 of the pick-and-place tool, and the first surface 104 of the first substrate 102 is arranged to face the second surface 204 of the second substrate 202. The pickup head 700 is provided to make contact with the majority of the surface area of the semiconductor structure 100, and thus edges of the semiconductor structure 100 may be upwardly bended. Consequently, the second bonding pads 120 in the edge region 152 of the semiconductor structure 100 may be outwardly shifted, and a distance d2' between the shifted second bonding pad 120 and its adjacent first bonding pad 110 is therefore made greater than the original distance d2, as shown in FIG. 2.

Referring to FIG. 3, the semiconductor structure 100 is then bonded to the semiconductor structure 200 by hybrid bonding. In the hybrid bonding, the first and second bonding pads 110 and 120 of the semiconductor structure 100 are bonded to the third bonding pads 210 of the semiconductor structure 200, and the dielectric layer 106 of the semiconductor structure 100 is bonded to the dielectric layer 206 of the semiconductor structure 200. As shown in FIG. 3, the third bonding pads 210 of the semiconductor structure 200 vertically align with and contact the first bonding pads 110 in the central region 150 of the semiconductor structure 100. More importantly, though the second bonding pads 120 may be outwardly shifted during the pick-and-place operation, the misalignment issue can be ignored because the enlarged second bonding pads 120 at least partially contact the third bonding pads 210 as shown in FIG. 3. Accordingly, electrical connection between the semiconductor structure 100 and the semiconductor structure 200 is constructed.

FIG. 4 is a schematic drawing illustrating another semiconductor structure 310 according to aspects of the present disclosure in some embodiments. It should be understood that similar features in FIGS. 3 and 4 are identified by the same reference numerals for clarity and simplicity. Furthermore, similar elements in FIGS. 3 and 4 can include similar materials, and thus those details are omitted in the interest of brevity. As shown in FIG. 4, in some embodiments of the present disclosure, the semiconductor structure 100 can be bonded to another semiconductor structure 200a to form the semiconductor package 310. The semiconductor structure 200a can include a semiconductor structure or a package component similar as the semiconductor structure 200, and thus only the difference is detailed. The semiconductor structure 200a includes a plurality of third bonding pads 210 and a plurality of fourth bonding pads 220 formed in a topmost dielectric layer 206 of the interconnection structure over the second surface 204 of the substrate 202.

Referring to FIG. 4, in some embodiments of the present disclosure, the third bonding pads 210 and the fourth bonding pads 220 are arranged to form an array of columns and rows. In some embodiments of the present disclosure, the fourth bonding pads 220 surround the third bonding pads 210. The third bonding pads 210 and the fourth bonding pads 220 can include various shapes as mentioned above, thus the details are omitted for simplicity. The third bonding pads 210 respectively include a third width W3 and the fourth bonding pads 220 respectively include a fourth width W4. In some embodiments, the third width W3 of the third bonding pads 210 is substantially different from the fourth width W4 of the fourth bonding pads 220. In some embodiments of the present disclosure, the fourth width W4 is substantially greater than the third width W3. In other words, at least one fourth bonding pad 220 including the fourth width W4 substantially different from the third width W3 of the third bonding pad 210 is provided. In some embodiments, the second width W2 is substantially the same as the fourth width W4.

Still referring to FIG. 4, a pick-and-place tool is used to pick, place and stack the semiconductor structure 100 onto the semiconductor structure 200a, In some embodiments of the present disclosure, a pickup head (not show) is provided to make contact with the majority of the surface area of the semiconductor structure 100, and thus edges of the semiconductor structure 100 may be upwardly bended. Consequently, the first bonding pads 110 may vertically align with the third bonding pads 210. However, the second bonding pads 120 in the edge region 152 of the semiconductor structure 100 may be outwardly shifted, and a distance d2' between the shifted second bonding pad 120 and its adjacent first bonding pad 110 is therefore made greater than the original distance d2.

Still referring to FIG. 4, the semiconductor structure 100 is then bonded to the semiconductor structure 200a to form the semiconductor package 310 by hybrid bonding, in the hybrid bonding, the first bonding pads 110 of the semiconductor structure 100 are bonded to the third bonding pads 210 of the semiconductor structure 200a, the second bonding pads 120 of the semiconductor structure 100 are bonded to the fourth bonding pads 220 of the semiconductor structure 200a, and the dielectric layer 106 of the semiconductor structure 100 is bonded to the dielectric layer 206 of the semiconductor structure 200a. More importantly, though the second bonding pads 120 may be outwardly shifted during the pick-and-place operation, the misalignment issue can be ignored because the enlarged second bonding pads 120 at least partially contact the enlarged fourth bonding pads 220 as shown in FIG. 4. Accordingly, electrical connection between the semiconductor structure 100 and the semiconductor structure 200a is constructed.

FIG. 5 is a schematic drawing illustrating another semiconductor structure 320 according to aspects of the present disclosure in some embodiments. It should be understood that similar features in FIGS. 3 and 5 are identified by the same reference numerals for clarity and simplicity. Furthermore, similar elements in FIGS. 3 and 5 can include similar materials, and thus those details are omitted in the interest of brevity. In some embodiments of the present disclosure, a semiconductor structure 100a is provided. The semiconductor structure 100a can include semiconductor structure similar as the semiconductor structure 100, and thus only the difference is detailed. In some embodiments of the present disclosure, the first bonding pads 110 include the first width W1, the second bonding pads 120a include the second width W2', and the second width W2' is the same as the first width W1. In some embodiments, the fourth width W4 of the fourth bonding pads 220 of the second semiconductor structure 200a is substantially greater than the firth width W1, the second width W2' or the third width W3.

Referring to FIG. 5, a pick-and-place tool is used to pick, place and stack the semiconductor structure 100a onto the semiconductor structure 200a. In some embodiments of the present disclosure, a pickup head (not shown) is provided to make contact with the majority of the surface area of the semiconductor structure 100a, and thus edges of the semiconductor structure 100a may be upwardly bended. Consequently, the first bonding pads 110 may vertically align with the third bonding pads 210. However, the second bonding pads 120a in the edge region 152 of the semiconductor structure 100a may be outwardly shifted, and a distance d2' between the shifted second bonding pad 120a and its adjacent first bonding pad 110 may be greater than the original distance d2.

Still referring to FIG. 5, the semiconductor structure 100a is then bonded to the semiconductor structure 200a to form a semiconductor package 320 by hybrid bonding. In the hybrid bonding, the first bonding pads 110 of the semiconductor structure 100a are bonded to the third bonding pads 210 of the semiconductor structure 200a, the second bonding pads 120a of the semiconductor structure 100 are bonded to the fourth bonding pads 220 of the semiconductor structure 200a, and the dielectric layer 106 of the semiconductor structure 100a is bonded to the dielectric layer 206 of the semiconductor structure 200a. More importantly, though the second bonding pads 120a may be outwardly shifted during the pick-and-place operation, the misalignment issue can be ignored because the second bonding pads 120a at least partially contact the enlarged fourth bonding pads 220 as shown in FIG. 5. Accordingly, electrical connection between the semiconductor structure 100a and the semiconductor structure 200a is constructed.

FIGS. 6A and 6B are schematic drawings illustrating a semiconductor structure 100b according to aspects of the present disclosure in some embodiments. It should be understood that similar features in FIGS. 1A-1B and 6A-6B are identified by the same reference numerals for clarity and simplicity. Furthermore, similar elements in FIGS. 1A-1B and 6A-6B can include similar materials, and thus those details are omitted in the interest of brevity. The semiconductor structure 100b can be similar as the semiconductor structure 100, and thus only the difference is detailed. In some embodiments of the present disclosure, the semiconductor structure 100b includes a plurality of first bonding pads 110, a plurality of second bonding pads 120, and a plurality of fifth bonding pads 130 over the first surface 104 of the substrate 102. In some embodiments of the present disclosure, the first, second and fifth bonding pads 110, 120 and 130 are formed in a topmost dielectric layer 106 of the interconnection structure over the first surface 104 of the substrate 102.

Referring to FIGS. 6A and 6B, in some embodiments of the present disclosure, the semiconductor structure 100b is generally a square including a length 140 and a width 142 in a plan view. The first bonding pads 110, the second bonding pads 120 and the fifth bonding pads 130 are arranged to form an array of columns and rows as shown in FIG. 6A. For example, the first bonding pads 110, the second bonding pads 120 and the fifth bonding pads 130 are arranged to form a plurality of columns along a first direction D1, and also arranged to form a plurality of row along a second direction D2 orthogonal to the first direction D1. In some embodiments of the present disclosure, the first bonding pads 110 are disposed in a central region 150, the second bonding pads 120 are disposed in an edge region 152 which surrounds the central region 150, and the fifth bonding pads 130 are disposed in a middle region 154 between the central region 150 and the edge region 152. As shown in FIG. 6A, the second bonding pads 120 are disposed adjacent to the edges and/or corners of the substrate 102. In some embodiments of the present disclosure, a width 144 of the edge region 152 can be equal to or less than one-tenth of the length 140 and/or the width 142 of the semiconductor structure 100b, but not limited to this. In some embodiments of the present disclosure, a width 146 of the middle region 154 can also be equal to or less than one-tenth of the length 140 and/or the width 142 of the semiconductor structure 100b, but not limited to this.

Still referring to FIGS. 6A and 6B, the first bonding pads 110, the second bonding pads 120 and the fifth bonding pads 130 can include various shapes as mentioned above, thus the details are omitted for simplicity. The first bonding pads 110 respectively include a first width W1, the second bonding pads 120 respectively include a second width W2, and the fifth bonding pads 140 respectively include a fifth width W5. In some embodiments, the first width W1, the second width W2 and the fifth width W5 can be substantially different from each other. In some embodiments of the present disclosure, the fifth width W5 is substantially greater than the first width W1, and the second width W2 is substantially greater than the fifth width W5. In other words, the second bonding pads 120 including the greatest width are disposed in the edge region 152, the first bonding pads 110 including the smallest width are disposed in the central region 150, and the fifth bonding pads 130 including the width between the greatest width and the smallest width are disposed in the middle region 154. It can be concluded that the width of the bonding pads can be increased outwardly from the central region 150 to the edge region 154. In some embodiments of the present disclosure, the second width W2 of the second bonding pads 120 are less than 5 µm, but not limited to this.

Additionally, the middle region 154 can further include a first middle region 1541 to an (n)th middle region 154n, and the (n)th middle region 154n surrounds the (n−1) middle region 154(n−1). The bonding pads in the (n)th middle region 154n include a width greater than the bonding pads in the (n−1)th middle region 154(n−1). In other words, the widths of the bonding pads between the central region 150 and the edge region 152 can be increased outwardly, if required.

As mentioned above, the semiconductor structure 100b can be bonded to another semiconductor structure. In some embodiments of the present disclosure, a pick-and-place tool is used to pick, place and stack the semiconductor structure 100b onto another semiconductor structure. Accordingly, a pickup head (not shown) is provided to make contact with the majority of the surface area of the semiconductor structure 100b, and thus edges of the semiconductor structure 100b may be upwardly bended. Consequently, the second bonding pads 120 in the edge region 152 and the fifth bonding pads 130 in the middle region 154 of the semiconductor structure 100b may be outwardly shifted. However, the misalignment issue can be ignored because the enlarged second bonding pads 120 and the enlarged fifth bonding pads 130 at least partially contact the bonding pads of the another semiconductor structure, and thus electrical connection is constructed.

FIG. 7A and FIG. 7B are schematic drawings illustrating a semiconductor structure 400 according to aspects of the present disclosure in some embodiments, FIG. 7A is a plan view of the semiconductor structure 400 and FIG. 7B is a sectional view of the semiconductor structure 400. It should be understood that similar elements in FIGS. 1A-1B and FIGS. 7A-7B can include similar materials, and thus those details are omitted in the interest of brevity. In some embodiments of the present disclosure, a semiconductor structure 400 is provided. The semiconductor structure 400 such as a die can be vertically bonded to another semiconductor structure or a package component to form a 3DIC package. The semiconductor structure 400 can include a substrate 402, and the substrate 402 may include active components or circuits, such as conductive features, implantation regions, resistors, capacitors, and other semiconductor elements e.g., transistors, diodes, etc. Those active components or circuits can be formed over the substrate 402 in FEOL operations in some embodiments, for example. An interconnect structure (not shown) can be formed over a first surface 404 of the substrate 402 in BEOL operations in some embodiments, for example. The interconnect structure includes conductive features, such as conductive lines and vias formed in an insulating material, which can include a plurality of dielectric layers in some embodiments of the present disclosure. The semiconductor structure 400 further includes a plurality of first bonding pads 410 and a plurality of second bonding pads 420 over the first surface 404 of the substrate 402. Some of the vias are electrically coupled the first and second bonding pads 410 and 420 to the conductive lines in the interconnect structure, and to the circuits over the substrate 402 through the conductive lines. The vias may also couple the conductive lines in different layers. In some embodiments of the present disclosure, the first and second bonding pads 410 and 420 are formed in a topmost dielectric layer 406 of the interconnection structure over the first surface 404 of the substrate 402.

Referring to FIGS. 7A and 7B, in some embodiments of the present disclosure, the semiconductor structure 400 is generally a square including a length 440 and a width 442 in a plan view. The first bonding pads 410 and the second bonding pads 420 are arranged to form an array of columns and rows as shown in FIG. 7A. For example, the first bonding pads 410 and the second bonding pads 420 are arranged to form a plurality of columns along a first direction D1, and also arranged to form a plurality of rows along a second direction D2 orthogonal to the first direction D1, in some embodiments of the present disclosure, the first bonding pads 410 are disposed in a central region 450 while the second bonding pads 420 are disposed in an edge region 452 which surrounds the central region 450. In other words, the second bonding pads 420 are disposed adjacent to the edges and/or corners of the substrate 402 as shown in FIG. 7A. In some embodiments of the present disclosure, a width 444 of the edge region 452 can be equal to or less than one-tenth of the length 440 and/or the width 442 of the semiconductor structure 400, but not limited to this.

Still referring to FIGS. 7A and 7B, the first bonding pads 410 and the second bonding pads 420 can include various shapes as mentioned above, thus the details are omitted for simplicity. The first bonding pads 410 respectively include a width W1 and the second bonding pads 420 respectively include a width W2. In some embodiments of the present disclosure, the width W1 of the first bonding pads 410 is substantially the same as the width W2 of the second bonding pads 420, but not limited to this. As shown in FIGS. 7A and 7B, the plurality of first bonding pads 410 can be spaced from each other in a first distance d1 and are arranged in a plurality of rows, and at least one second bonding pad 420 is adjacent to one first bonding pad 410 at an end of the row. In some embodiments, a second distance d2 between the second bonding pad 420 and its adjacent first bonding pad 410 at the end of the row is substantially different from the first distance d1. In some embodiments of the present disclosure, the second distance d2 is smaller than the first distance d1. In some embodiments of the present disclosure, a difference Δd between the first distance d1 and the second distance d2 can be related to a size and/or a thickness of the semiconductor structure 400. For example but not limited to, the difference Δd can be correlated positively with the size of the semiconductor structure 400. For example but not limited to, the difference Δd can be correlated negatively with the thickness of the semiconductor structure 400.

Additionally, in some embodiments of the present disclosure, the first bonding pads 410 can be spaced from each other in a first distance d1 and are arranged in a plurality of columns, and at least one second bonding pad 420 is adjacent to a first bonding pad 410 at an end of the column. In some embodiments, a second distance d2 between the second bonding pad 420 and its adjacent first bonding pad 410 at the end of the column is substantially different from the first distance d1. In some embodiments of the present disclosure, the second distance d2 is smaller than the first distance d1. In some embodiments of the present disclosure, a difference Δd between the first distance d1 and the second distance d2 can be related to a size and/or a thickness of the semiconductor structure 400. For example but not limited to, the difference Δd can be correlated positively with the size of the semiconductor structure 400. For example but not limited to, the difference Δd can be correlated negatively with the thickness of the semiconductor structure 400.

It can be understood that second distance d2 between the second bonding pad 420 in the edge region 452 and the first bonding pad 410 in the central region 450 is smaller than the first distance d1 between two adjacent bonding pads 410 in the central region 450. Furthermore, a plurality of third bonding pads 422 is disposed nearest to corners of the first substrate 402. The third bonding pads 422 include a width W3, and the third width W3 of the third bonding pads 422 can be the same as the width W2 of the second bonding pads 420, but not limited to this. As shown in FIG. 7A, the third bonding pad 422 is disposed adjacent to one of the second bonding pads 420 along the first direction D1. Also, the third bonding pad 422 is adjacent to another second bonding pad 420 along the second direction D2. In other words, the third bonding pad 422 is adjacent to one of the second bonding pads 420 in a direction perpendicular to the rows. The third bonding pad 422 is also adjacent to another second bonding pad 420 in a direction perpendicular to the columns, that is parallel with the rows. Accordingly, a third distance d3 is defined between the third bonding pad 422 and its adjacent second bonding pad 420 in the direction parallel with the rows (the second direction D2) and also defined between the third bonding pad 422 and its adjacent second boding pad 420 in the direction perpendicular to the rows (the first direction D1). In some embodiments, the third distance d3 is equal to the second distance d2 in both of the first direction D1 and the second direction D2.

FIGS. 8-9 are schematic drawings illustrating a semiconductor structure 600 according to aspects of the present disclosure in some embodiments. It should be understood that similar features in FIGS. 7A-7B and 8-9 are identified by the same reference numerals for clarity and simplicity. Furthermore, similar elements in FIGS. 7A-7B and 8-9 can include similar materials, and thus those details are omitted in the interest of brevity. As shown in FIGS. 8-9, in some embodiments of the present disclosure, the semiconductor structure 400 can be bonded to another semiconductor structure 500 to form the semiconductor package 600. The semiconductor structure 500 can include a semiconductor structure or a package component. In some embodiments of the present disclosure, the semiconductor structure 500 can be a package substrate strip, an interposer wafer, a packaged wafer, a device wafer, or the like. In some embodiments of the present disclosure, the semiconductor structure 500 can include a second substrate 502, and the second substrate 502 may include active components or circuits, such as conductive features, implantation regions, resistors, capacitors, and other semiconductor elements e.g., transistors, diodes, etc. Those active components or circuits can be formed over the substrate 502 in FEOL operations in some embodiments, for example. An interconnect structure (not shown) can be formed over a second surface 504 of the second substrate 502 in BEOL operations in some embodiments, for example. As mentioned above, the interconnect structure can include conductive features, such as conductive lines and vias formed in an insulating material. In some embodiments, the insulating material can include multiple dielectric layers.

The semiconductor structure 500 includes a plurality of fourth bonding pads 510 over the second surface 504 of the second substrate 502. Some of the vias electrically couple the third bonding pads 510 to the conductive lines in the interconnect structure, and to the circuits over the second substrate 502 through the conductive lines. The vias may also couple the conductive lines in different layers. The conductive lines and the vias can include conductive materials typically used in BEOL operations. In some embodiments of the present disclosure, the fourth bonding pads 510 are formed in a topmost dielectric layer 506 of the interconnection structure over the second surface 504 of the second substrate 502.

Referring to FIGS. 8-9, in some embodiments of the present disclosure, the fourth bonding pads 510 are arranged to form an array of columns and rows. The fourth bonding pads 510 can include various shapes as mentioned above, thus the details are omitted for simplicity. The fourth bonding pads 510 respectively include a width W4 as shown in FIGS. 8-9. In some embodiments of the present disclosure, the width W4 of the fourth bonding pads 510 can be the same as the width W1 of the first bonding pads 410, but not limited to this. In some embodiments of the present disclosure, a fourth distance d4 between two adjacent fourth bonding pads 510 can be the same as the first distance d1 between the two adjacent first bonding pads 410.

Referring to FIG. 8, a pick-and-place tool is used to pick, place and stack the semiconductor structure 400 onto the semiconductor structure 500. FIG. 8 illustrates a pickup head 700 of the pick-and-place tool, and the first surface 404 of the first substrate 402 is arranged to face the second surface 504 of the second substrate 502. The pickup head 700 is provided to make contact with the majority of the surface area of the semiconductor structure 400, and thus edges of the semiconductor structure 400 may be upwardly bended. Consequently, the second bonding pads 420 in the edge region 452 of the semiconductor structure 400 may be outwardly shifted, and a distance d2' between the shifted second bonding pad 420 and its adjacent first bonding pad 410 is therefore made greater than the original second distance d2 before the pick-and-place operation, as shown in FIG. 8. Additionally, the third bonding pads 422 near the corner of the semiconductor structure 400 may be shifted, and a distance (not shown) between the shifted third bonding pad 422 and its adjacent second bonding pad 420 is therefore made greater than the original distance d2.

Referring to FIG. 9, the semiconductor structure 400 is then bonded to the semiconductor structure 500 to form the semiconductor package 500 by hybrid bonding. In the hybrid bonding, the first, second and third bonding pads 410, 420 and 422 of the semiconductor structure 400 are bonded to the fourth bonding pads 510 of the semiconductor structure 500, and the dielectric layer 406 of the semiconductor structure 400 is bonded to the dielectric layer 506 of the semiconductor structure 500. In other words, the fourth bonding pads 510 at least vertically align with the first bonding pads 410 in the central region 450 of the semiconductor structure 400. More importantly, though the second bonding pads 420 and the third bonding pads 422 may be outwardly shifted during the pick-and-place operation, the misalignment issue can be mitigated because the original second distance d2 is made smaller and the outwardly-shifted second bonding pads 420 at least partially contact the fourth bonding pads 510 as shown in FIG. 9. Accordingly, electrical connection between the semiconductor structure 400 and the semiconductor structure 500 is constructed.

Figure 10:
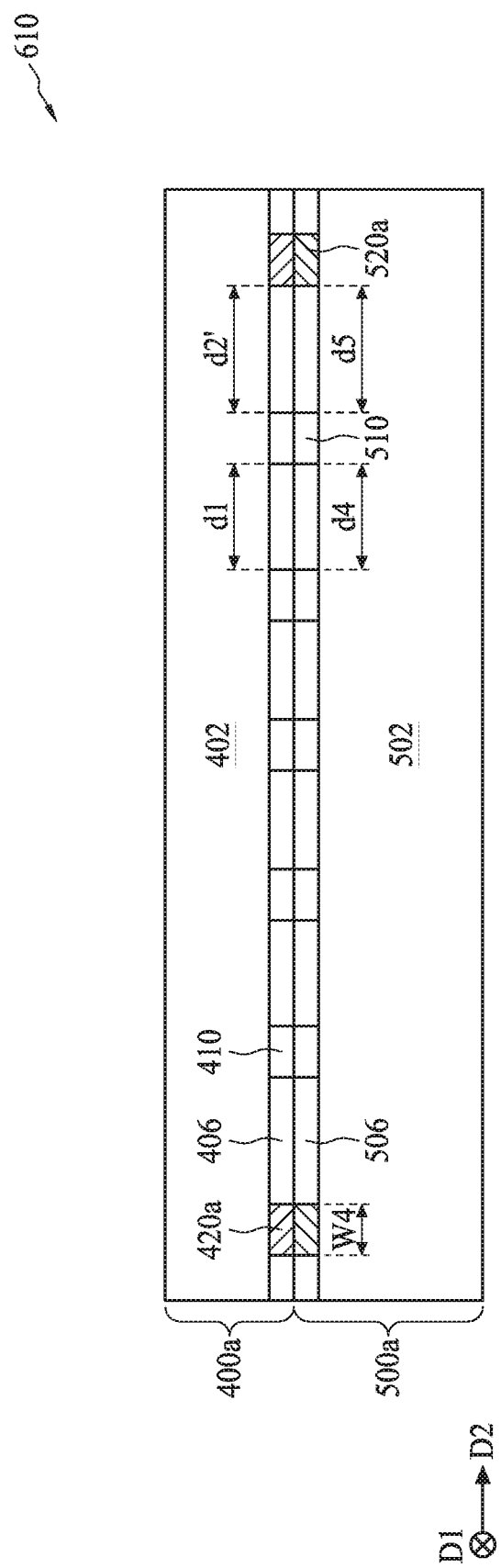
FIG. 10 is a schematic drawing illustrating a semiconductor structure according to aspects of the present disclosure in some embodiments.

Please refer to FIG. 10, which is a schematic drawing illustrating another semiconductor structure 610 according to aspects of the present disclosure in some embodiments. It should be understood that similar features in FIGS. 9 and 10 are identified by the same reference numerals for clarity and simplicity. Furthermore, similar elements in FIGS. 9 and 10 can include similar materials, and thus those details are omitted in the interest of brevity. As shown in FIG. 10, in some embodiments of the present disclosure, a semiconductor structure 400a can be bonded to another semiconductor structure 500a to form the semiconductor package 610. The semiconductor structure 400a can include a semiconductor structure or a package component similar as the semiconductor structure 400, and thus only the difference is detailed.

In the semiconductor structure 400a, a second distance d2 between the second bonding pads 420a and its adjacent first bonding pad 410 is the same as the first distance d1 between two adjacent first bonding pads 410.

Referring to FIG. 10, the semiconductor structure 500a can include a semiconductor structure or a package component the similar as the semiconductor structure 500, and thus only the difference is detailed. The semiconductor structure 500a includes a plurality of fourth bonding pads 510 and a plurality of fifth bonding pads 520a over the second surface 504 of the substrate 502. In some embodiments of the present disclosure, the fourth bonding pads 510 and the fifth bonding pads 520a are arranged to form an array of columns and rows. In some embodiments of the present disclosure, the fifth bonding pads 520a surround the fourth bonding pads 510. The fourth bonding pads 510 and the fifth bonding pads 520a can include various shapes as mentioned above, thus the details are omitted for simplicity. In some embodiments of the present disclosure, the fourth bonding pads 510 and the fifth bonding pads 520a can include a same width W4, but not limited to this. And the width W4 can be the same as the width W1 of the first bonding pads 410, but not limited to this. In some embodiments of the present disclosure, the fourth bonding pads 510 can be spaced from each other in a fourth distance d4 and are arranged in a plurality of columns or rows. At least one fifth bonding pad 520a is adjacent to a fourth bonding pad 510 at an end of the column or row. More importantly, a fifth distance d5 between the fifth bonding pad 520a and its adjacent fourth bonding pad 510 at the end of the column or row is substantially different from the fourth distance d4. In some embodiments of the present disclosure, the fifth distance d5 is greater than the fourth distance d4. In some embodiments of the present disclosure, a difference Δd between the fifth distance d5 and the fourth distance d4 can be related to a size and/or a thickness of the semiconductor structure 400a.

Still referring to FIG. 10, a pick-and-place tool is used to pick, place and stack the semiconductor structure 400a onto the semiconductor structure 500a. In some embodiments of the present disclosure, a pickup head (not shown) of the pick-and-place tool is provided to make contact with the majority of the surface area of the semiconductor structure 400a, and thus edges of the semiconductor structure 400a may be upwardly bended. Consequently, the first bonding pads 410 may vertically align with the fourth bonding pads 510. However, the second bonding pads 420a in the edge region 442 of the semiconductor structure 400a may be outwardly shifted, and a distance d2' between the shifted second bonding pad 420a and its adjacent first bonding pad 410 is therefore made greater than the original distance d2.

Still referring to FIG. 10, the semiconductor structure 400a is then bonded to the semiconductor structure 500a to form the semiconductor package 610 by hybrid bonding. In the hybrid bonding, the first bonding pads 410 of the semiconductor structure 400a are bonded to the fourth bonding pads 510 of the semiconductor structure 500a, the second bonding pads 420a of the semiconductor structure 400a are bonded to the fifth bonding pads 520a of the semiconductor structure 500a, and the dielectric layer 406 of the semiconductor structure 400a is bonded to the dielectric layer 506 of the semiconductor structure 500a. More importantly, though the second bonding pads 420 may be outwardly shifted during the pick-and-place operation, the misalignment issue can be mitigated because the fifth distance d5 between the fourth bonding pads 510 and the fifth bonding pads 520a is made larger and the outwardly-shifted second bonding pads 420a at least partially contact the fifth bonding pads 520*a* as shown in FIG. 10. Accordingly, electrical connection between the semiconductor structure 400*a* and the semiconductor structure 500*a* is constructed.

Figure 12:
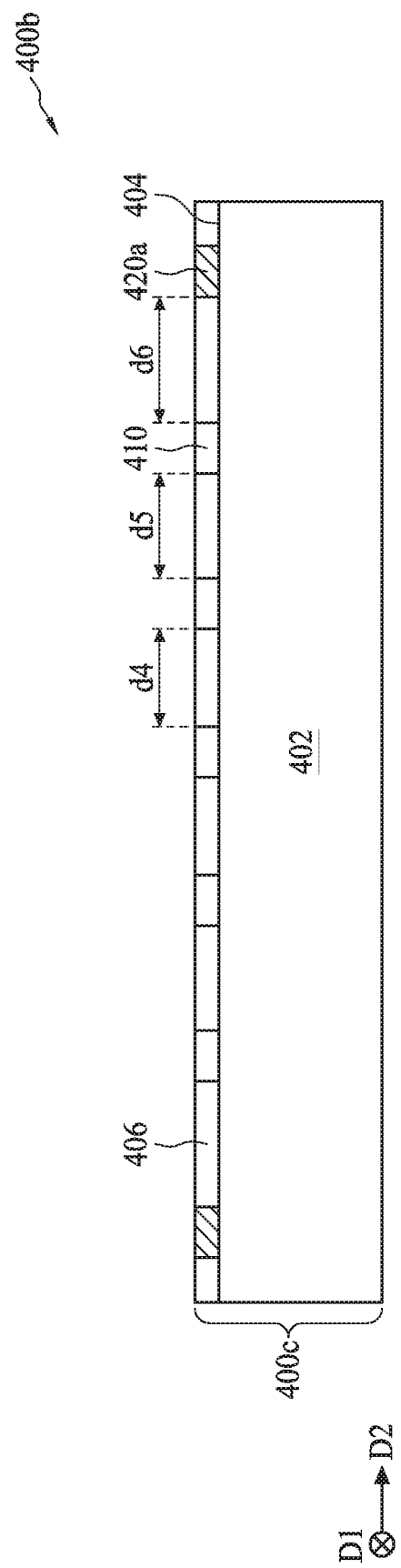
FIG. 12 is a schematic drawing illustrating a semiconductor structure according to aspects of the present disclosure in some embodiments.

FIGS. 11A-11B and 12 are schematic drawings illustrating a semiconductor structure 400*b* according to aspects of the present disclosure in some embodiments. It should be understood that similar features in FIGS. 7A-7B and 11A-12 are identified by the same reference numerals for clarity and simplicity. Furthermore, similar elements in FIGS. 7A-7B and 11A-12 can include similar materials, and thus those details are omitted in the interest of brevity. The semiconductor structure 400*b* can include a semiconductor structure or a package component similar as the semiconductor structure 400, and thus only difference is detailed. The semiconductor structure 400*b* includes a plurality of first bonding pads 410, a plurality of second bonding pads 420, and a plurality of sixth bonding pads 430 formed in a topmost dielectric layer 406 of the interconnection structure over a first surface 404 of the substrate 402.

Referring to FIGS. 11A-11B and 12, in some embodiments of the present disclosure, the semiconductor structure 400*b* is generally a square including a length 440 and a width 442 in a plane view. The first bonding pads 410, the second bonding pads 420 and the sixth bonding pads 430 are arranged to form an array of columns and rows as shown in FIG. 11A. For example, the first bonding pads 410, the second bonding pads 420 and the sixth bonding pads 430 are arranged to form a plurality of columns along a first direction D1, and also arranged to form a plurality of row along a second direction D2 orthogonal to the first direction D1. In some embodiments of the present disclosure, the first bonding pads 410 are disposed in a central region 450, the sixth bonding pads 430 are disposed in an edge region 454 which surrounds the central region 450, and the second bonding pads 420 are disposed in a middle region 452 between the central region 450 and the edge region 454. As shown in FIG. 11A, the sixth bonding pads 430 are disposed adjacent to the edges and/or corners of the substrate 402. As shown in FIGS. 11A and 11B, the plurality of first bonding pads 410 can be spaced from each other in a first distance d1 and are arranged in a plurality of rows, and at least one second bonding pad 420 is adjacent to a first bonding pad 410 at an end of the row. Furthermore, a sixth bonding pad 430 is adjacent to a second bonding pad 420 along the same row. More importantly, a second distance d2 between the second bonding pad 420 and its adjacent first bonding pad 410 at the end of the row is substantially different from the first distance d1, and a sixth distance d6 between the sixth bonding pad 430 and its adjacent second bonding pad 420 is substantially different from the second distance d2. In some embodiments of the present disclosure, the second distance d2 is smaller than the first distance d1, and the sixth distance d6 is smaller than the second distance d2 as shown in FIGS. 11A-11B. In some embodiments of the present disclosure, the second distance d2 is greater than the first distance d1, and the sixth distance d6 is greater than the second distance d2 as shown in FIG. 12. Additionally, in some embodiments of the present disclosure, the distance between bonding pads arranged in the same row and/or the same column can increased or decreased radially from the central region 454.

As mentioned above, the semiconductor structure 400*b* can be bonded to another semiconductor structure. In some embodiments of the present disclosure, a pick-and-place tool is used to pick, place and stack the semiconductor structure 400*b* onto another semiconductor structure. Accordingly, a pickup head (not shown) is provided to make contact with the majority of the surface area of the semiconductor structure 400*b*, and thus edges of the semiconductor structure 400*b* may be upwardly bended. Consequently, the second bonding pads 420 in the Middle region 452 and the sixth bonding pads 430 in the edge region 454 of the semiconductor structure 400*b* may be outwardly shifted. However, the misalignment issue can be mitigated because the original second/sixth distance d2/d6 are made smaller, and the outwardly-shifted second/sixth bonding pads 420/430 at least partially contact the bonding pads of the another semiconductor structure, and thus electrical connection is constructed.

Figure 13:
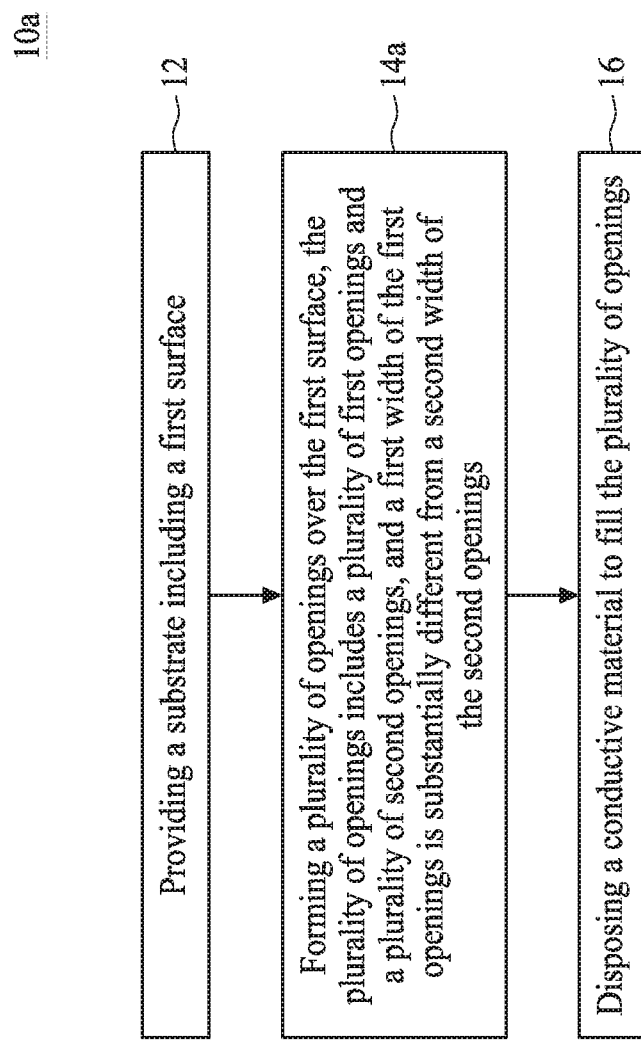
FIG. 13 is a flow chart representing a method for manufacturing a semiconductor structure in accordance with some embodiments of the present disclosure.

FIG. 13 is a flow chart representing a method for manufacturing a semiconductor structure 10*a* in accordance with some embodiments of the present disclosure. The method for manufacturing the semiconductor structure 10*a* includes an operation 12, providing a substrate including a first surface. The method for manufacturing the semiconductor package 10*a* further includes an operation 14*a*, forming a plurality of openings over the first surface. It is noteworthy that the plurality of openings include a plurality of first openings and a plurality of second openings, and a first width of the first openings is substantially different from a second width of the second openings. The method for manufacturing the semiconductor structure 10*a* includes an operation 16, disposing a conductive material to fill the plurality of openings. The method for manufacturing the semiconductor structure 10*a* will be further described according to one or more embodiments.

Figure 14:
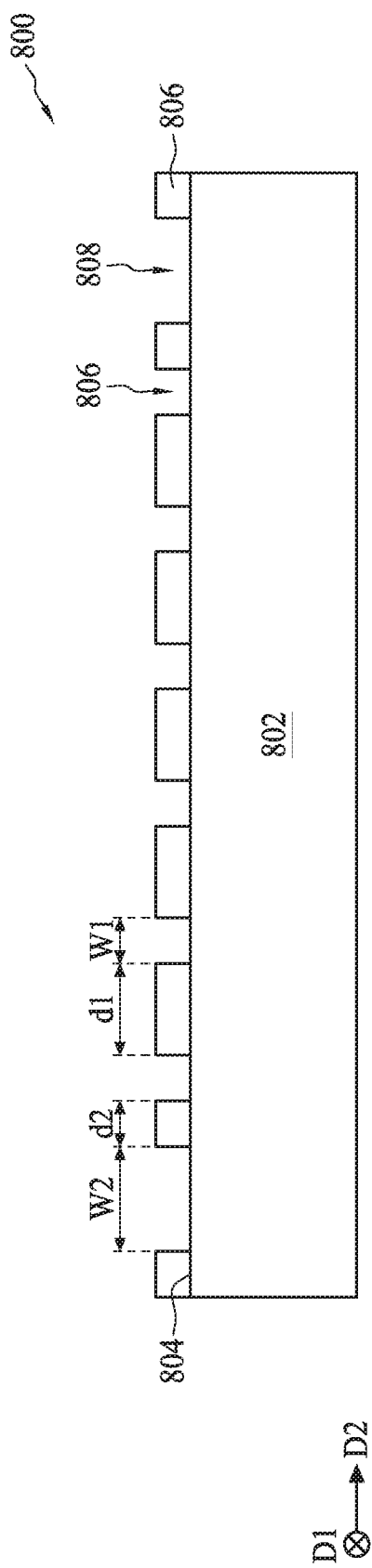
FIGS. 14 through 15 illustrate sectional views of a semiconductor structure at various fabrication stages constructed according to aspects of the present disclosure in one or more embodiments.
Figure 15:
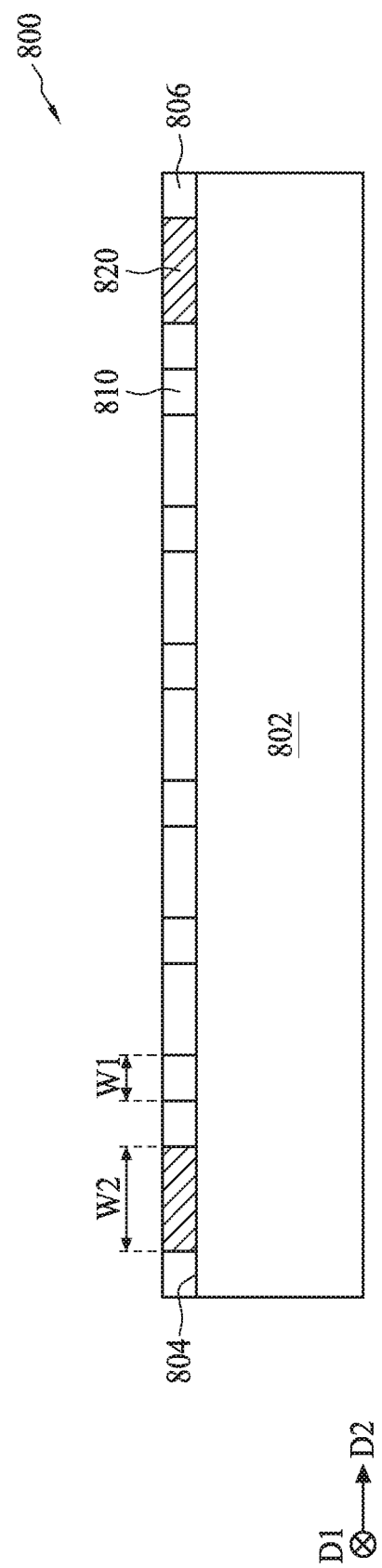

FIGS. 14 through 15 illustrate sectional views of a semiconductor structure 800 at various fabrication stages constructed according to aspects of the present disclosure in some embodiments. In some embodiments of the present disclosure, a substrate 802 including a first surface 804 is provided according to operation 12. The substrate 102 may include active components or circuits formed in FEOL operations in some embodiments, for example. An interconnect structure (not shown) can be formed over the first surface 804 of the substrate 802 in BEOL operations in some embodiments, for example. The interconnect structure includes a topmost dielectric layer 806. Next a plurality of openings is formed in the topmost dielectric layer 806 over the first surface 804 according to operation 14*a*. It is noteworthy that the plurality of openings further includes a plurality of first openings 806 and a plurality of second openings 808. In some embodiments of the present disclosure, the semiconductor structure 800 is generally a square including a length (not shown) and a width (not shown) in a plan view. The first openings 806 and the second openings 808 are arranged to form an array of columns and rows. In some embodiments of the present disclosure, the second openings 808 surround the first openings 806. More importantly, the first openings 806 include a first width W1, the second openings 808 include a second width W2, and the second width W2 is greater than the first width W1, as shown in FIG. 14. In some embodiments of the present disclosure, a difference ΔW between the first width W1 and the second width W2 can be related to a size and/or a thickness of the semiconductor structure 800. For example but not limited to, the difference ΔW can be correlated positively with the size of the semiconductor structure 800. For example but not limited to, the difference ΔW can be correlated negatively with the thickness of the semiconductor structure 800. Furthermore, at least one of the second openings 808 is adjacent to one of the first openings 806, and a distance d2 between the second opening 808 and its adjacent first opening 806 is less than a distance d1 between two adjacent first openings 806 as shown in FIG. 14.

Referring to FIG. 15, a conductive material is then disposed to fill the openings according to operation 16. A planarization operation can be subsequently performed to remove superfluous conductive material. Consequently, a plurality of first bonding pads 810 and a plurality of second bonding pads 820 are obtained. And a width W2 of the second bonding pads 820 is greater than a width W1 of the first bonding pads 810. It should be noted that in the operations 14a, parameters such as the widths of the openings can be modified such that the abovementioned bonding pads can be obtained, and those details are omitted in the interest of brevity.

Figure 16:
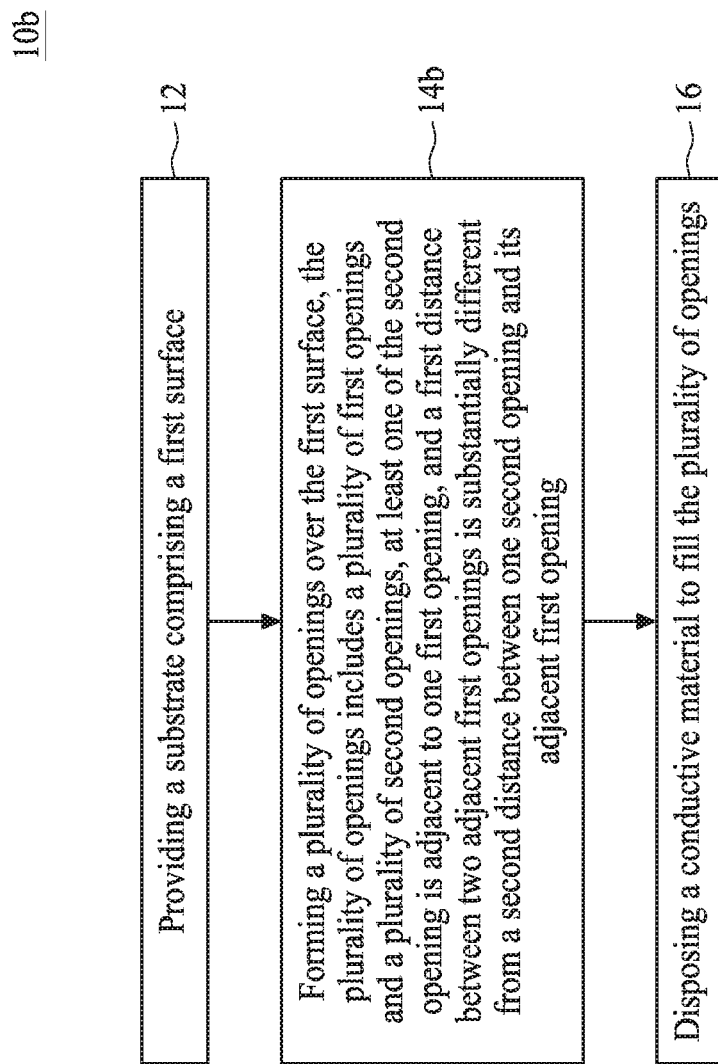
FIG. 16 is a flow chart representing a method for manufacturing a semiconductor structure in accordance with some embodiments of the present disclosure.

FIG. 16 is a flow chart representing a method for manufacturing a semiconductor structure 10b in accordance with some embodiments of the present disclosure. The method for manufacturing the semiconductor structure 10b includes an operation 12, providing a substrate including a first surface. The method for manufacturing the semiconductor structure 10b further includes an operation 14b, forming a plurality of openings over the first surface. It is noteworthy that the plurality of openings include a plurality of first openings and a plurality of second openings, at least one of the second opening is adjacent to one first opening, and a first distance between two adjacent first openings is substantially different from a second distance between one second opening and its adjacent first opening. The method for manufacturing the semiconductor structure 10b further includes an operation 16, disposing a conductive material to fill the plurality of openings. The method for manufacturing the semiconductor structure 10a will be further described according to one or more embodiments.

Figure 17:
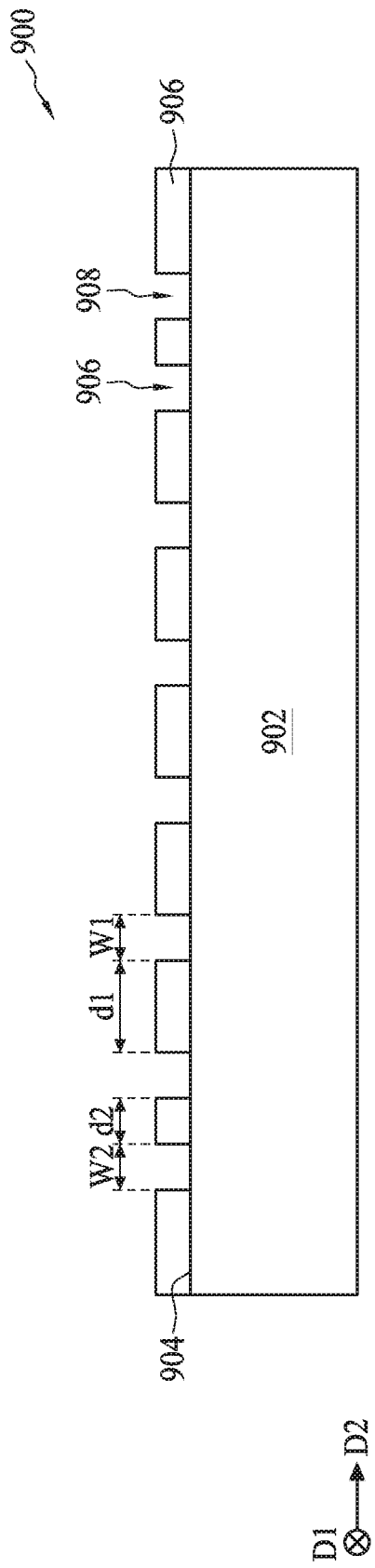
FIGS. 17 through 18 illustrate sectional views of a semiconductor structure at various fabrication stages constructed according to aspects of the present disclosure in one or more embodiments.
Figure 18:
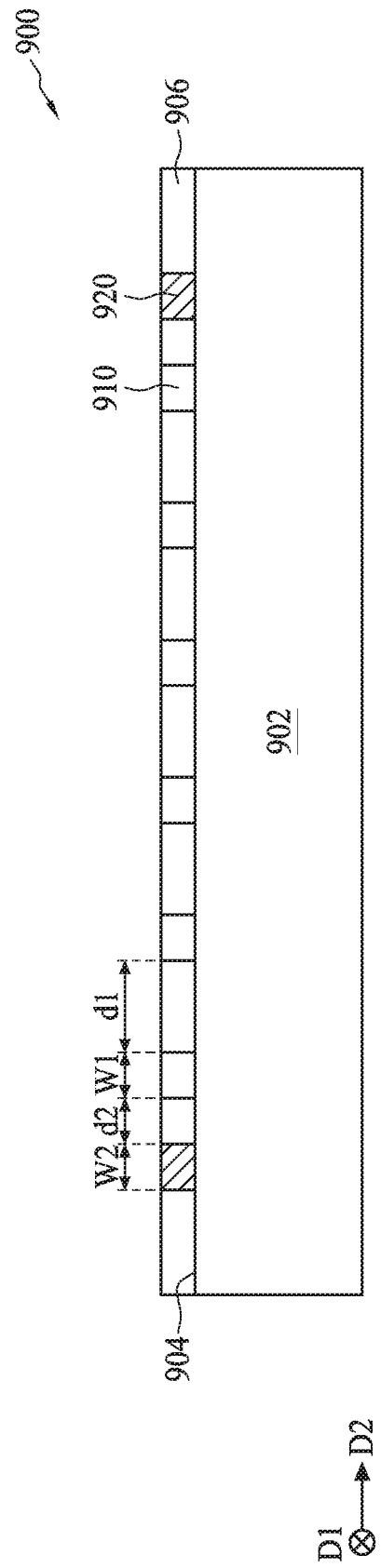
Figure 19:
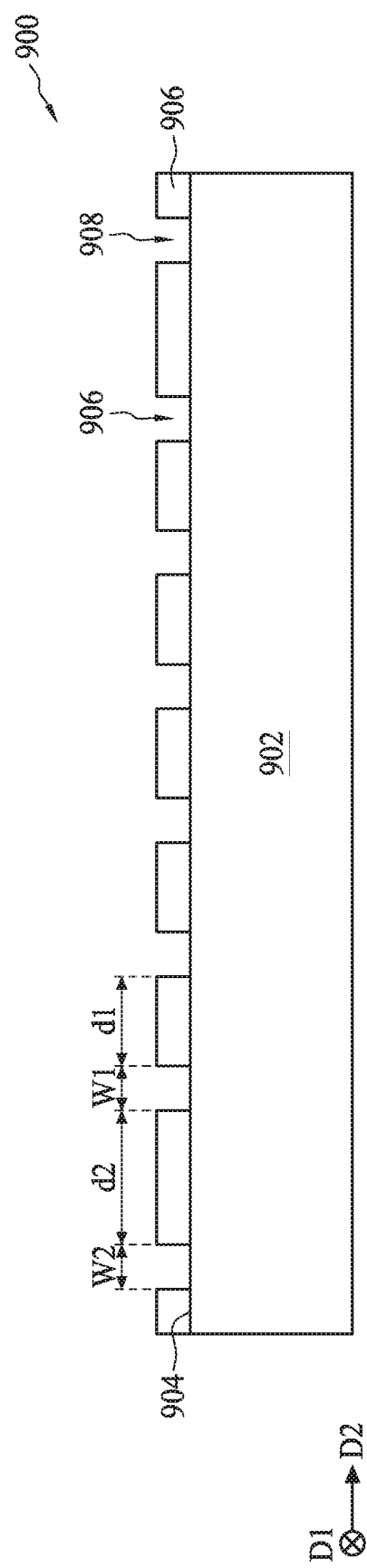
FIG. 19 is a schematic drawing illustrating a semiconductor structure according to aspects of the present disclosure in some embodiments.

FIGS. 17 through 18 illustrate sectional views of a semiconductor structure 900 at various fabrication stages constructed according to aspects of the present disclosure in some embodiments. In some embodiments of the present disclosure, a substrate 902 including a first surface 904 is provided according to operation 12. The substrate 902 may include active components or circuits formed in FEOL operations in some embodiments, for example. An interconnect structure (not shown) can be formed over the first surface 904 of the substrate 902 in BEOL operations in some embodiments, for example. The interconnect structure includes a topmost dielectric layer 906. Next a plurality of openings is formed in the topmost dielectric layer 906 over the first surface 904 according to operation 14b. It is noteworthy that the plurality of openings further includes a plurality of first openings 906 and a plurality of second openings 908. In some embodiments of the present disclosure, the semiconductor structure 900 is generally a square including a length (not shown) and a width (not shown) in a plan view. The first openings 906 and the second openings 908 are arranged to form an array of columns and rows. In some embodiments of the present disclosure, the second openings 908 surround the first openings 906. More importantly, the first openings 906 include a width W1, the second openings 908 include a width W2, and the width W2 can be substantially the same as the width W1, as shown in FIG. 17. Furthermore, at least one of the second openings 908 is adjacent to one of the first openings 906. A first distance d1 between two adjacent first openings 906 is substantially different from a second distance d2 between the second opening 908 and its adjacent first opening 906. In some embodiments of the present disclosure, and the second distance d2 is less than the first distance d1 as shown in FIG. 17. However, in some embodiments of the present disclosure, the distance d2 is greater than the distance d1 as shown in FIG. 19. In some embodiments of the present disclosure, a difference Δd between the first distance d1 and the second distance d2 can be related to a size and/or a thickness of the semiconductor structure 900. For example but not limited to, the difference Δd can be correlated positively with the size of the semiconductor structure 900. For example but not limited to, the difference Δd can be correlated negatively with the thickness of the semiconductor structure 900.

Referring to FIG. 18, a conductive material is then disposed to fill the openings according to operation 16. A planarization operation can be subsequently performed to remove superfluous conductive material. Consequently, a plurality of first bonding pads 910 and a plurality of second bonding pads 920 are obtained. It should be noted that in the operations 14b, parameters such as the distance between the openings can be modified such that the abovementioned bonding pads can be obtained, and those details are omitted in the interest of brevity.

In the present disclosure, the bonding pads located in the edge region can be shifted inwardly related to the central region or made larger than the bonding pads located in the central region. Therefore, when the distance between the bonding pad in the edge region and its adjacent bonding pad in the central region is increased during pick-and-place operation, the misalignment issue is mitigated. On the other hands, the bonding pads located in the edge region can be shifted outwardly related to the central region or made larger than the bonding pads located in the central region. Therefore, when the semiconductor structure is bonded to another semiconductor structure which suffers pad shift issue during pick-and-place operation, the misalignment issue is still mitigated.

In some embodiments, a semiconductor structure is provided. The semiconductor structure includes a first substrate, a first dielectric layer disposed over the first substrate, a plurality of first bonding pads disposed in the first dielectric layer, a plurality of second bonding pads disposed in the first dielectric layer, a second substrate, and a second dielectric layer disposed over the second substrate. The first bonding pads have a first width, and the second bonding pads have a second width greater than the first width. The second bonding pads are arranged to form a frame pattern surrounding the first bonding pads. A portion of the second dielectric layer is in physical contact with the second bonding pads. The first bonding pads and the second bonding pads are arranged to form a plurality of columns and a plurality of rows. Two of the second bonding pads are disposed at two opposite ends of each column and two opposite ends of each row.

In some embodiments, a semiconductor structure is provided. The semiconductor structure includes a first substrate, a dielectric layer disposed over the first substrate, a plurality of first bonding pads disposed in the dielectric layer, and a plurality of second bonding pads disposed in the dielectric layer. The first bonding pads have a first width, and the second bonding pads have second width less than the first width. The second bonding pads are arranged to form a frame pattern surrounding the first bonding pads. The first bonding pads and the second bonding pads are arranged to form a plurality of first columns and a plurality of first rows. Two of the second bonding pads are disposed at two opposite ends of each first column and two opposite ends of each first row.

In some embodiments, a method for manufacturing a semiconductor structure is provided. The method includes following operations. A first surface is provided. A dielectric layer is formed over the first substrate. The dielectric layer includes a plurality of first openings and a plurality of second openings. The first openings and the second openings are filled with a conductive material to form a plurality of first bonding pads and a plurality of second bonding pads. A second substrate is provided. The second substrate includes a plurality of third bonding pads. Bonding the first bonding pads and the second bonding pads to the third bonding pads. One of the first bonding pads is separated from one of the second bonding pads by a first distance before the bonding. The one of the first bonding pads is separated from the one of the second bonding pads by a second distance after the bonding. The second distance is greater than the first distance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claim is:

1. A semiconductor structure comprising:
a first substrate;
a first dielectric layer disposed over the first substrate;
a plurality of first bonding pads disposed in the first dielectric layer and comprising a first width;
a plurality of second bonding pads disposed in the first dielectric layer and comprising a second width greater than the first width, wherein the second bonding pads are arranged to form a frame pattern surrounding the first bonding pads;
a second substrate; and
a second dielectric layer disposed over the second substrate,
wherein a portion of the second dielectric layer is in physical contact with the second bonding pad, and
wherein the first bonding pads and the second bonding pads are arranged to form a plurality of columns and a plurality of rows, and two of the second bonding pads are disposed at two opposite ends of each column and two opposite ends of each row.

2. The semiconductor structure of claim 1, wherein the second bonding pads are disposed adjacent to edges or a corner of the first substrate.

3. The semiconductor structure of claim 1, further comprising plurality of third bonding pads disposed in the second dielectric layer, wherein the third bonding pads comprise a third width different from the first width of the first bonding pads.

4. The semiconductor structure of claim 3, wherein each of the third bonding pads is in physical contact with a portion of the one of the first bonding pads or a portion of the one of the second bonding pads.

5. The semiconductor structure of claim 3, wherein the second width is substantially greater than the third width.

6. The semiconductor structure of claim 3, wherein the third width of the third bonding pads is the same as the first width of the first bonding pads.

7. The semiconductor structure of claim 3, further comprising a plurality of fourth bonding pads disposed in the second dielectric layer, wherein the fourth bonding pad comprises a fourth width greater than the third width.

8. The semiconductor structure of claim 7, wherein the third bonding pads contact with the first bonding pads, and the fourth bonding pads contact with the second bonding pads.

9. The semiconductor structure of claim 1, further comprising a fifth bonding pad disposed in the first dielectric layer and between the first bonding pads and the second bonding pads, wherein the fifth bonding pad comprises a fifth width greater than the first width and less than the second width.

10. The semiconductor structure of claim 1, wherein at least a sidewall of the first substrate is aligned with a sidewall of the second substrate.

11. A semiconductor structure comprising:
a first substrate;
a dielectric layer disposed over the first substrate;
a plurality of first bonding pads disposed in the dielectric layer and comprising a first width; and
a plurality of second bonding pads disposed in the dielectric layer and comprising a second width less than the first width, wherein the second bonding pads are arranged to form a frame pattern surrounding the first bonding pads,
wherein the first bonding pads and the second bonding pads are arranged to form a plurality of first columns and a plurality of first rows, and two of the second bonding pads are disposed at two opposite ends of each first column and two opposite ends of each first row,
wherein the first bonding pads are spaced apart from each other in a first distance, and the second bonding pad is separated from its adjacent first bonding pad in a second distance, and the second distance is greater than the first distance.

12. The semiconductor structure of claim 11, further comprising:
a second substrate comprising a surface facing the first substrate;
a plurality of third bonding pads disposed on the surface of the second substrate and comprising a third width; and
a plurality of fourth bonding pads disposed on the surface of the second substrate and comprising a fourth width greater than the third width.

13. The semiconductor structure of claim 12, wherein the third bonding pads and the fourth bonding pads are arranged in a plurality of second columns and a plurality of second rows, and two of the fourth bonding pads are disposed at two opposite ends of each second column and two opposite ends of each second row.

14. A method for forming a semiconductor structure, comprising:
providing a first substrate;
forming a first dielectric layer comprising a plurality of first openings and a plurality of second openings over the first substrate;
filling the first openings and the second openings with a conductive material to form a plurality of first bonding pads and a plurality of second bonding pads;
providing a second substrate comprising a plurality of third bonding pads;
picking the first substrate with the first bonding pads and the second bonding pads facing the second substrate; and
bonding the first bonding pads and the second bonding pads to the third bonding pads,
wherein one of the first bonding pads is separated from one of the second bonding pads by a first distance before the picking of the first substrate, and the first distance is increased to a second distance by the picking of the first substrate.

15. The method of claim 14, wherein the first openings have a first width, the second openings have a second width, and the second width is substantially greater than the first width.

16. The method of claim 14, wherein the first bonding pads are separated from each other by a third distance, and the third distance is less than the second distance.

17. The method of claim 14, wherein the first bonding pads and the second bonding pads are arranged to form a plurality of columns and a plurality of rows, and two of the second bonding pads are disposed at two opposite ends of each column and two opposite ends of each row.

18. The method of claim 14, wherein the second substrate comprises a second dielectric layer, and the third bonding pads are disposed in the second dielectric layer.

19. The method of claim 18, wherein the second bonding pad is in contact with the third boding pad and the second dielectric layer.

20. The method claim 14, wherein a sidewall of the first substrate is aligned with a sidewall of the second substrate after the bonding.

* * * * *